US011373455B2

(12) United States Patent
Brim

(10) Patent No.: US 11,373,455 B2
(45) Date of Patent: Jun. 28, 2022

(54) PREDICTING ELECTROMECHANICAL ACTUATOR HEALTH AND REMAINING LIFE

(71) Applicant: WOODWARD, INC., Fort Collins, CO (US)

(72) Inventor: Miles W. Brim, Fort Collins, CO (US)

(73) Assignee: Woodward, Inc., Fort Collins, CO (US)

( * ) Notice: Subject to any disclaimer, the term of this patent is extended or adjusted under 35 U.S.C. 154(b) by 441 days.

(21) Appl. No.: 15/959,721

(22) Filed: Apr. 23, 2018

(65) Prior Publication Data

US 2019/0325663 A1 Oct. 24, 2019

(51) Int. Cl.
*G07C 3/02* (2006.01)
*G01R 31/34* (2020.01)
*G06N 7/00* (2006.01)

(52) U.S. Cl.
CPC ............. *G07C 3/02* (2013.01); *G01R 31/343* (2013.01); *G06N 7/005* (2013.01)

(58) Field of Classification Search
CPC ....................................................... G07C 3/02
See application file for complete search history.

(56) References Cited

U.S. PATENT DOCUMENTS 3,209,717 A * 10/1965 Campbell .............. B63H 11/04
114/151
6,636,814 B1 * 10/2003 McCullers ............. B61D 19/02
702/34
2005/0033557 A1 * 2/2005 House ................ G05B 23/0283
702/184

(Continued)

FOREIGN PATENT DOCUMENTS

EP 3270250 1/2018

OTHER PUBLICATIONS

PCT International Search Report and Written Opinion of the International Searching Authority in International Application No. PCT/US2019/026450, dated Jun. 19, 2019, 14 pages.

(Continued)

*Primary Examiner* — Jennifer Bahls
(74) *Attorney, Agent, or Firm* — Fish & Richardson P.C.

(57) ABSTRACT

Methods, systems, and apparatus for predicting electromechanical actuator health and remaining life include a method storing a reliability model coupled to a controlled actuator system comprising a motive force system coupled to a driven mechanical system. The motive force system is associated with motive force parameters. The driven mechanical system is associated with driven mechanical parameters. The reliability model represents a probability of failure of the controlled actuator system over time based on motive force parameters and driven mechanical parameters. Operational parameters of the controlled actuator system, received over time from a sensor system coupled to the controlled actuator system, include one of the motive force parameters or driven mechanical parameters. The operational parameters represent a degradation of the controlled actuator system over time. The reliability model is updated to represent a revised probability of failure. A state of the controlled actuator system is determined using the updated reliability model.

20 Claims, 16 Drawing Sheets

(56) References Cited

U.S. PATENT DOCUMENTS

2006/0005623 A1\* 1/2006 Hildebrand ......... F16F 15/1414
  73/468
2017/0350789 A1 12/2017 Poon et al.
2019/0273457 A1\* 9/2019 Deng .................... H02P 21/141

OTHER PUBLICATIONS

PCT International Preliminar Report on Patentability in International Appln. No. PCT/US2019/026450, dated Nov. 5, 2020, 9 pages.

\* cited by examiner

PREDICTING ELECTROMECHANICAL ACTUATOR HEALTH AND REMAINING LIFE

TECHNICAL FIELD

This specification relates to techniques for predicting electromechanical actuator system health and remaining life.

BACKGROUND

Predictive reliability and systems engineering prognostics can be used to optimize preventive maintenance planning for equipment and can provide sufficient warning in the event of an impending failure. Reliability prediction can require large sample sizes and may still provide a high uncertainty in predictions. Unscheduled downtime and ineffective preventive maintenance programs can be a large source of lost revenue in industry, amounting to significant financial losses every year. The modern state of the Internet of Things (IoT) generates a great deal of data, but very little of it is used to achieve savings or create revenue. Much of this data is directly relevant to predictive reliability and systems engineering prognostics.

SUMMARY

This specification describes technologies relating to techniques for predicting electromechanical actuator system health and remaining life.

In general, one innovative aspect of the subject matter described in this specification can be embodied in methods that include the actions of: storing, on a computer system coupled to a controlled actuator system, a set of operational mode definitions, a reliability model per operational mode, the controlled actuator system comprising a motive force system coupled to and providing an operating force to a driven mechanical system, the motive force system associated with a plurality of motive force parameters, the driven mechanical system associated with a plurality of driven mechanical parameters, a reliability model representing a probability of failure of the controlled actuator system over time for each operational mode, each reliability model's hazard rate regression model based on one or more of the plurality of motive force parameters and one or more of the plurality of driven mechanical parameters, the set of test definitions and analysis by which the plurality of driven and motive force parameters are acquired, and a plurality of statistical models that use the plurality of driven and motive force parameters to determine the probability of a system existing in an operational mode; receiving, over time, by the computer system and from a sensor system coupled to the controlled actuator system, one or more operational parameters of the controlled actuator system, the one or more operational parameters including one of the motive force parameters or one of the driven mechanical parameters, the one or more operational parameters representing a degradation of the controlled actuator system over time; updating, by the computer and based on the received one or more operational parameters, the reliability model according to the hazard rate regression model to represent a revised probability of failure of the controlled actuator system over time and the statistical model to represent a revised probability of existing in an operational mode; determining, by the computer system and based on the updated reliability model, that the controlled actuator system is approaching failure; and in response, transmitting, by the computer system, a signal indicating that the controlled actuator system is approaching failure.

These and other embodiments can each optionally include one or more of the following features. The reliability model can be a first reliability model, and the method can further include storing, on the computer system, a plurality of reliability models including the first reliability model, where each reliability model can be associated with a respective category of operation of the controlled actuator system, where the one or more operational parameters of the controlled actuator system can vary based on the category, the hazard rate regression models can vary based on the category, and the statistical models that represent the probability of existing in the respective category can vary based on the category, and where each reliability model can represent a respective probability of failure of the controlled actuator system over time when operated based on the one or more operational parameters associated with the respective category. The respective category of operation can include at least one of: normal operation in which the controlled actuator system is operated under a normal operational parameter range for each motive force parameter and each driven mechanical parameter, accelerated wear operation in which the controlled actuator system is operated in a condition in which at least one motive force parameter or at least one driven mechanical parameter is operated outside a respective normal operational parameter range, operation using non-conforming components in which a component of either the motive force system or the driven mechanical system operates outside the normal operational parameter range for the component, or failure operation resulting from a failure inducing change to the normal operational parameter of a motive force parameter or a driven mechanical parameter. The method can further include identifying the respective category from the one or more operational parameters received from the sensor system using the statistical models that represent the probability of existing in the respective category updating a reliability model associated with the identified respective category. The one or more operational parameters can be received during an operation of the controlled actuator system. The one or more operational parameters can be received when the controlled actuator system is off-line and operating a controlled diagnostic sequence. The motive force system can include an electric motor motive force or a hydraulic actuator motive force. The plurality of motive force parameters includes one or more of a magnet torque constant, a rotor inertia, unbalanced rotation terms, a set of winding resistances, a set of winding inductances, a set of motor bearing and windage viscous friction, and a set of motor bearing static or dynamic Coulomb friction. The driven mechanical system can include a rotary or linear actuator connected to source of motive force by one or more of a plurality of: a direct connection, a geared connection, or a screw-drive conversion. The driven mechanical parameters can include an actuator inertia and mass, a set of spring constants, a gear meshing constant, frequency, and phase, a set of screw-drive efficiencies, backlash and dead-band terms, unbalanced rotation terms, non-aligned linear motion terms, a set of actuator bearing viscous frictions, a set of bearing and shaft on seal dynamic or static Coulomb frictions, and a valve load.

In general, another aspect of the subject matter described in this specification can be embodied in systems that include a system comprising: a driven mechanical system, the driven mechanical system associated with a plurality of driven mechanical parameters; a motive force system coupled to and driven by the driven mechanical system, the motive force system associated with a plurality of motive force parameters; a sensor system comprising a plurality of sensors, the sensor system coupled to the driven mechanical system or the motive force system, the plurality of sensors configured to sense one or more operational parameters of the controlled actuator system, the one or more operational parameters including one of the motive force parameters or one of the driven mechanical parameters, the one or more operational parameters representing a degradation of the controlled actuator system over time; and a computer system coupled to the driven mechanical system, the motive force system, and the sensor system. The computer system comprises one or more processors; and a non-transitory computer-readable medium storing instructions executable by the one or more processors to perform operations. The operations include: storing a reliability model representing a probability of failure of the controlled actuator system over time for each operational mode, each reliability model's hazard rate regression model based on one or more of the plurality of motive force parameters and one or more of the plurality of driven mechanical parameters, the set of test definitions and analysis by which the plurality of driven and motive force parameters are acquired, and a plurality of statistical models that use the plurality of driven and motive force parameters to determine the probability of a system existing in an operational mode; and updating the reliability model to represent a revised probability of failure over time based on the received one or more operational parameters and updating the statistical model to represent the probability of existing in an operational mode.

These and other embodiments can each optionally include one or more of the following features. The operations can further include: determining, by the computer system and based on the updated reliability model, that either the driven mechanical system or the motive force system is approaching failure; and in response, transmitting, by the computer system, a signal indicating that either the driven mechanical system or the motive force system is approaching failure. The one or more operational parameters can be received during an operation of the controlled actuator system. The one or more operational parameters can be received when the controlled actuator system is off-line and operating a controlled diagnostic sequence. The motive force system can include an electric motor motive force or a hydraulic actuator motive force. The plurality of motive force parameters can include one or more of a magnet torque constant, a rotor inertia, unbalanced rotation terms, a set of winding resistances, a set of winding inductances, a set of motor bearing and windage viscous friction, and a set of motor bearing static or dynamic Coulomb friction. The driven mechanical system can include a rotary or linear actuator connected to source of motive force by one or more of a plurality of: a direct connection, a geared connection, or a screw-drive conversion. The driven mechanical parameters can include an actuator inertia and mass, a set of spring constants, a gear meshing constant, frequency, and phase, a set of screw-drive efficiencies, backlash and dead-band terms, unbalanced rotation terms, non-aligned linear motion terms, a set of actuator bearing viscous frictions, a set of bearing and shaft on seal dynamic or static Coulomb frictions, and a valve load.

In general, another aspect of the subject matter described in this specification can be embodied in methods that include the actions of identifying a plurality of driven mechanical parameters associated with a driven mechanical system; identifying a plurality of motive force parameters associated with a motive force system coupled to and driven by the driven mechanical system; identifying, for each driven mechanical parameter and each motive force parameter, a respective value; determining a plurality of diagnostic sequence test and analysis definitions necessary to arrive at a respective value for the driven and motive force parameters; determining a plurality of regression models relating the driven mechanical parameters and motive force parameters to remaining life; determining an operational mode representing an operation of the driven mechanical system driven by the motive force system based on each respective value identified for each driven mechanical parameter and each motive force parameter; determining a plurality of statistical models representing the probability of existing in an identified operational mode; determining a plurality of reliability models representing the probability of failure of the controlled actuator system; measuring one or more operational parameters during an off-line operation of the motive force system to drive the driven mechanical system, where the one or more operational parameters represent degradation of the controlled actuator system; updating the statistical model representing the probability of existing in an identified operational mode used the measured parameters; updating the reliability model's regression model using the measured parameters; and identifying a set of metrics that describe the degradation of the motive force system driven by the driven mechanical system over time using a statistical method and the one or more operational parameters measured during the off-line operation.

These and other embodiments can each optionally include one or more of the following features. Updating the expected behavior can include developing a dynamic reliability model representing an updated expected behavior based on the set of probabilities, alpha errors and beta errors from the statistical models for each operational mode and the set of updated reliability models for each operational mode.

Other embodiments of this aspect include corresponding systems, apparatus, and computer programs, configured to perform the actions of the methods, encoded on computer storage devices.

Particular embodiments of the subject matter described in this specification can be implemented so as to realize one or more of the following advantages. First, the set of techniques described in the present disclosure for determining health and reliability factors can be incorporated into existing and future systems that are driven by closed-loop control. Second, the solutions can be provided as a saleable software product to provide data as to actuator health and remaining life, which the user can use to prevent unscheduled down-time and optimize preventive maintenance scheduling (for example, to schedule a best time for preventive maintenance). Third, the health and reliability data can be used by the end user to proactively identify actuators with low health needing replacement, as opposed to replacing the actuators when they fail, which may be at an inconvenient time and require lengthy lead times for replacement. Fourth, cloud feedback provided to the original equipment manufacturer (OEM) by the system can be used to optimize forecasting and thus reduce lead times and achieve a more efficient production process. Fifth, inventory management of production materials by the OEM can be financially optimized based on a more accurate forecast of equipment health and expected life. Sixth, user knowledge of reduced health and reliability can allow the user to make control modifications that place less stress on the system and prolong its life. Seventh, the health and reliability data can be used to provide a signal that an emergency shutdown is needed.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
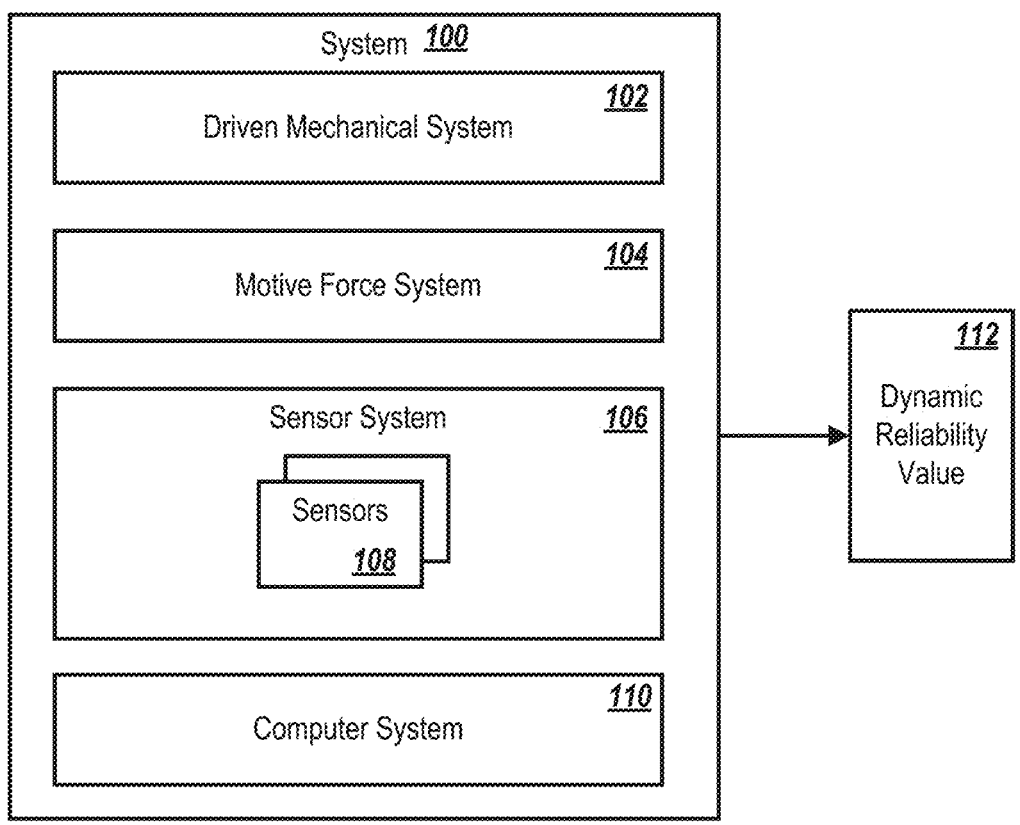
FIG. 1A is a block diagram of an example of a system for predicting electromechanical actuator health and remaining life, according to an implementation of the present disclosure.

The following detailed description describes techniques for using active sensor measurements to predict electromechanical actuator system health and remaining life and is presented to enable any person skilled in the art to make and use the disclosed subject matter in the context of one or more particular implementations. Various modifications, alterations, and permutations of the disclosed implementations can be made and will be readily apparent to those of ordinary skill in the art, and the general principles defined can be applied to other implementations and applications, without departing from the scope of the present disclosure. In some instances, details unnecessary to obtain an understanding of the described subject matter have been omitted so as to not obscure one or more described implementations with unnecessary detail, and inasmuch as such details are within the skill of one of ordinary skill in the art. The present disclosure is not intended to be limited to the described or illustrated implementations, but to be accorded the widest scope consistent with the described principles and features.

This disclosure describes techniques for assessing the health and reliability of a controlled system by an off-line diagnostic. The techniques can use a detailed electro-mechanical model, failure-mode analysis, the structured development of diagnostic sequences and corresponding metrics based on failure-mode analysis, reliability testing, Kernel Principal Component Analysis (KPCA) or other statistical methods of identifying correlations with time-to-failure, and the Weibull proportional hazards model (WPHM) to construct a reliability model for a given category of operation or failure-mode. A unique set of algorithms and probability models can be used to assess the degree to which a new system belongs to a given category of operation or failure mode. The dynamic reliability assessment of the system can be scaled according to the set of WPHMs and probability models.

Aspects of the techniques include the following concepts: a structured method of selecting degradation metrics, an application of KPCA to identify useful metrics for each system tested, a method of identifying common metrics that apply across a given category of operation or failure modes, the use of WPHM to construct failure-mode reliability models, the development of a probability model to assess whether a failure-mode is active, and the development of a corresponding algorithm for scaled reliability prediction.

Certain constraints and assumptions can apply to a system to which the techniques described in this disclosure are applied. First, the system can be modeled. Second, the system can be driven by a closed-loop control. Third, feedback information from a controller is available for extraction and analysis. Fourth, the system has a bounded set of states, such as between Opened and Closed. Fifth, lab testing or field testing can be performed with a sufficient sample size in order to establish a set of reliability models. Sixth, an off-line diagnostic capability is available and applied with a high and consistent frequency, such as using a real-time method.

The techniques described in the present disclosure can be implemented on existing electromechanical actuators with a change to the control system firmware and the development of a method of visualizing the output, both of which could be done remotely without the addition of hardware. System feedback to the end user can allow real-time identification of actuators with low health, allowing for optimization of preventive maintenance scheduling and the prevention of unscheduled downtime. Cloud feedback to the Original Equipment Manufacturer (OEM) can allow real-time identification of actuators with low health, allowing replacement builds by the OEM to occur before actual failure. Cloud feedback can also help optimize production planning inventory levels and provide greater confidence in product reliability as shipped. In some implementations, the end user can make modifications to the system demand and control system in response to reduced performance and system health.

The techniques described in the present disclosure can provide meaningful results despite uncertainty in the precise shape of reliability models that are developed and used. An end user may not be concerned with minute system reliability details, but may care more about macroscopic functionality. In other words, the user wants to know whether a piece of equipment works and will continue to work as expected. The techniques described in the present disclosure can provide a quantifiable scaling between normal operation and "failure-mode" operation. Furthermore, algorithms can be continually refined as new data is provided, such as from fleets of installed systems via Cloud feedback to the OEM.

Algorithms can tie a physical model of a failure mode to properties of expected energy consumption rates, for example, that come out of a motor. The algorithms can scale the significance of potential failure-mode indicator measurements to the frequency, magnitude, and age of the measurement. The algorithms can use data representing known good systems and those failing because of the identified failure-mode, which can be used to construct an approximate reliability model for each. Scaled energy metrics can then be used to identify the degree to which a given system belongs in one population or the other. An end user can benefit from knowledge as to impending system failure, whether accelerated rates of system degradation are underway, whether normal operating conditions are present, and the expected remaining system life.

Implementations of the described subject matter, including the previously described implementation, can be implemented using a computer-implemented method; a non-transitory, computer-readable medium storing computer-readable instructions to perform the computer-implemented method; and a computer-implemented system comprising one or more computer memory devices interoperably coupled with one or more computers and having tangible, non-transitory, machine-readable media storing instructions that, when executed by the one or more computers, perform the computer-implemented method/the computer-readable instructions stored on the non-transitory, computer-readable medium.

FIG. 1A is a block diagram of an example of a system 100 for predicting electromechanical actuator health and remaining life. In some implementations, the system 100 can be a controlled actuator system.

The system 100 includes a driven mechanical system 102 that is associated with multiple driven mechanical parameters and state variables. The system 100 includes a motive force system 104 that is coupled to and driven by the driven mechanical system 102. The motive force system 104 is associated with multiple motive force parameters and state variables. Each system model can include the use of parameters and state variables, some of which are directly measured by sensors. Also, a given metric can be a parameter or a mathematical manipulation of the parameter. Typically, a manipulated version of a metric can represent a degradation of the system.

The system 100 includes a sensor system 106 that includes one or more sensors 108. The sensor system 106 is coupled to either one of the driven mechanical system 102 or the motive force system 104 (or to both). The one or more sensors 108 are configured to sense one or more operational parameters or state variables of the controlled actuator system. The one or more operational parameters or state variables include one of the motive force parameters or state variables or one of the driven mechanical parameters or state variables. The one or more operational parameters, state variables, or mathematical manipulations of the two can represent a degradation of the controlled actuator system over time. The one or more operational parameters, state variables, or mathematical manipulations of the two can be received during an operation of the controlled actuator system or received when the controlled actuator system is off-line by direct sensor measurement or by analysis of the data received during a pre-defined actuation sequence.

A computer system 110 is coupled to the driven mechanical system 102, the motive force system 104, and the sensor system 106. The computer system 110 includes one or more processors and a non-transitory computer-readable medium storing instructions executable by the one or more processors to perform operations. The operations include: 1) storing a reliability model representing a probability of failure of the driven mechanical system 102 or the motive force system 104 over time, where the reliability model is based on time to fail data and the multiple motive force parameters, state variables, and the corresponding derived metrics, the multiple driven mechanical parameters, state variables, and the corresponding derived metrics; and 2) updating the reliability model to represent a revised probability of failure over time based on the received one or more operational parameters, state variables, or derived metrics.

In some implementations, the operations can further include determining, by the computer system 110 and based on the updated reliability model, that either the driven mechanical system 102 or the motive force system 104 is approaching failure. In response, the computer system 110 can transmit a signal indicating that either the driven mechanical system 102 or the motive force system 104 is approaching failure. In some implementations, the signal can be a dynamic reliability value 112 that a customer can use to make decisions regarding the timing of repair or replacement of a component of the system 100 such as a motor or an actuator. Another customer decision can be to change the operation of the system 100 in some way (for example, slowing the speed or other setting of a piece of equipment to delay or prevent failure). In some implementations, the signal can be a command that is sent to one or more of the components of the system 100, where the command causes an automatic change in operation of the system 100.

An example of the system 100 that is used throughout this disclosure can include a 3-phase, multi-pole (e.g., four-pole) brushless direct current (BLDC) motor that drives a rotary valve directly connected to the motor, which is coupled with a safety return spring. The valve and motor can both be mounted on bearings. Overall, the system 100 can include the motive force motor system 104 and the driven mechanical system 102.

The motive force motor system 104 can use a 3-phase, multi-pole BLDC motor that includes the following specifications, for example: 1) a magnet torque constant, $\lambda_m=5$ pound (lb)-in/Amp root mean square (RMS); 2) a rotor inertia, $J_m=2.5$ lb-in/s$^2$; 3) a winding resistance, $r_s=0.5$ Ohms; 4) a winding inductance, $L_{ss}=2.0$ millihenries (mH); 5) a motor bearing and windage viscous friction, $B_m=0.005$ lb-in-s/rad; and 6) a motor bearing dynamic coulomb friction–$f_m=0.8$ lb-in.

The driven mechanical system 102 can be, for example, a rotary actuator that is directly connected to the motor and coupled with a safety return spring (e.g., with a full range of motion of 0 to pi radians). The driven mechanical system 102 can have the following specifications, for example: 1) an actuator inertia, $J_a=5$ lb-in s$^2$; 2) actuator bearing viscous friction, $B_a=0.005$ lb-in-s/rad; 3) a bearing dynamic coulomb friction, $f_a=0.4$ lb-in; 4) a valve load, $T_L=0$, (with no load being present in the offline diagnostic); and 5) a rotary safety return spring with spring constant K=125 lb/rad.

The techniques described in the present disclosure are not limited to the motive force system and driven force system given in the example. Applications of the techniques can apply to other systems that include, but are not limited to, linear and rotary valve motion, electric and hydraulic actuation, model components such as non-BLDC electric motors, hydraulic actuators, gears, linear springs, ball screws, and other means of converting rotary motion to linear motion. Similarly, other model terms may include, but are not limited to, non-linear viscous friction and spring constants, gear meshing constants and periodic behavior, ball screw efficiencies, backlash or dead band terms, and other electrical properties such as coil capacitance.

In some implementations, a process for constructing a dynamic reliability value, and the corresponding models that compose it, can use the following steps. These steps are shown in an activity diagram, FIG. 1C. For example, the steps can be used in modeling, operating, testing, and evaluating the system 100 using models and parameters that are described with reference to the Equations below. In some implementations, the steps can use or generate stored information that is identified in the block definition diagram shown in FIG. 1B and the activity diagram shown in FIG. 1C. An outline of the stored values are shown in Table 1:

TABLE 1

| Stored Information | | |
|---|---|---|
| Stored Information | Quantity | Description |
| Operational Reliability Modes | Multiple | Normal wear, accelerated wear, Failure-Modes, etc. |
| Reliability model | One per operational mode | As determined by Reliability testing time to fail data |
| Metrics | One or more per Reliability model | As determined by Reliability testing parameters that correlate with time to fail data |
| Regression model | One per Reliability model | A function of the monitoring parameters |
| WPHM Model | One per Reliability model | A function relating the regression model and reliability model |
| Monitoring tests | One or more per Reliability model | Those tests necessary to measure the monitoring parameters |
| Probability model | One or more per Operational mode | Test(s) to determine the probability that a given operational reliability mode is active. |
| Test Algorithms | One or more per Monitoring test | The data manipulation to convert test sequence data into metrics |
| Dynamic reliability model reported value | One | The sum of the product of reliability and probability for each Operational mode. This would also have a corresponding alpha and beta error. |
| Dynamic reliability model visualization | One | A combined Reliability model that is scaled from the Reliability models of each Operational mode according to the corresponding Probability. |

Figure 1B:
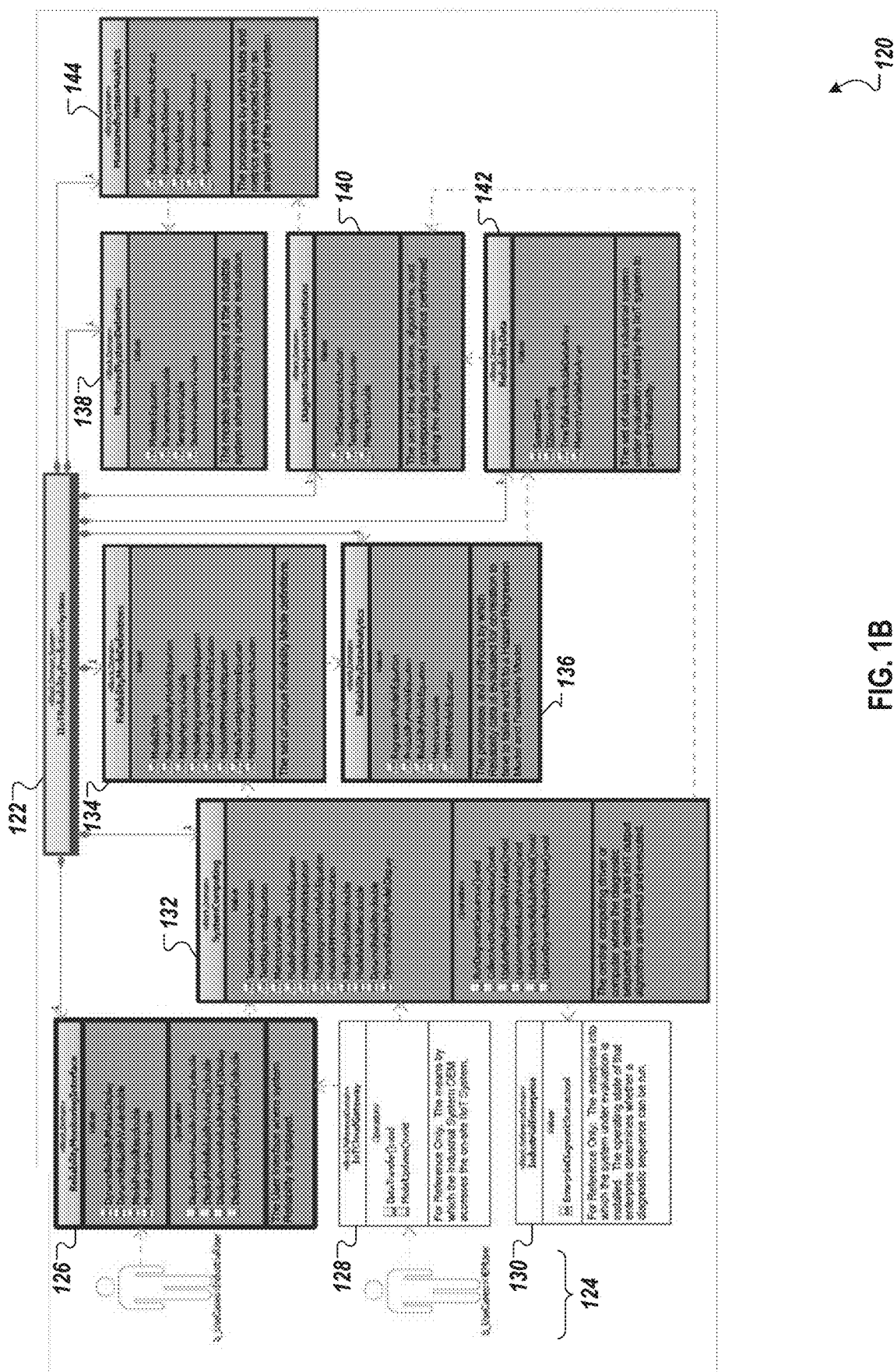
FIG. 1B is a block definition diagram representing an example implementation method of a system for predicting electromechanical actuator health and remaining life, according to an implementation of the present disclosure.

FIG. 1B is a block definition diagram representing an example implementation method of a system 120 for predicting electromechanical actuator health and remaining life, according to an implementation of the present disclosure. The system 120 can be a reliability prediction system, for example. An IoT reliability prediction system controller 122 can serve as a controller for components of the system 120. Users 124 of the system 120 can include industrial users (including users of equipment, such as actuators and motors) and OEM users (including manufacturers of equipment). A reliability monitoring interface 126 can include values and operations needed to provide and support a user interface for the industrial users and to perform operations based on selections made by the industrial users. The reliability monitoring interface 126 can display system reliability information to the industrial users. An IoT cloud gateway component 128 can provide ways by which OEM users 124 interface with the system 120. An industrial enterprise 130 can be a system that includes equipment that is being evaluated. A system computing component 132 can serve as a central computing driver (or computer) where diagnostics sequence definitions and IoT algorithm output algorithms are stored and executed. Reliability mode definitions 134 can include reliability mode definitions used by the system 120. Reliability data analytics 136 can include processes and methods by which reliability data is evaluated. Monitored system definitions 138 can include the models and definitions of the industrial system whose reliability is under evaluation. Diagnostic sequence definitions 140 can include a set of test definitions, algorithms, and corresponding extracted metrics performed during a diagnostic. Reliability data 142 can include a set of data for each industrial system under evaluation and used by the IoT system to predict reliability. Monitored system analytics 144 can include processes by which tests and metrics are extracted from an analysis of the monitored system.

Figure 1C:
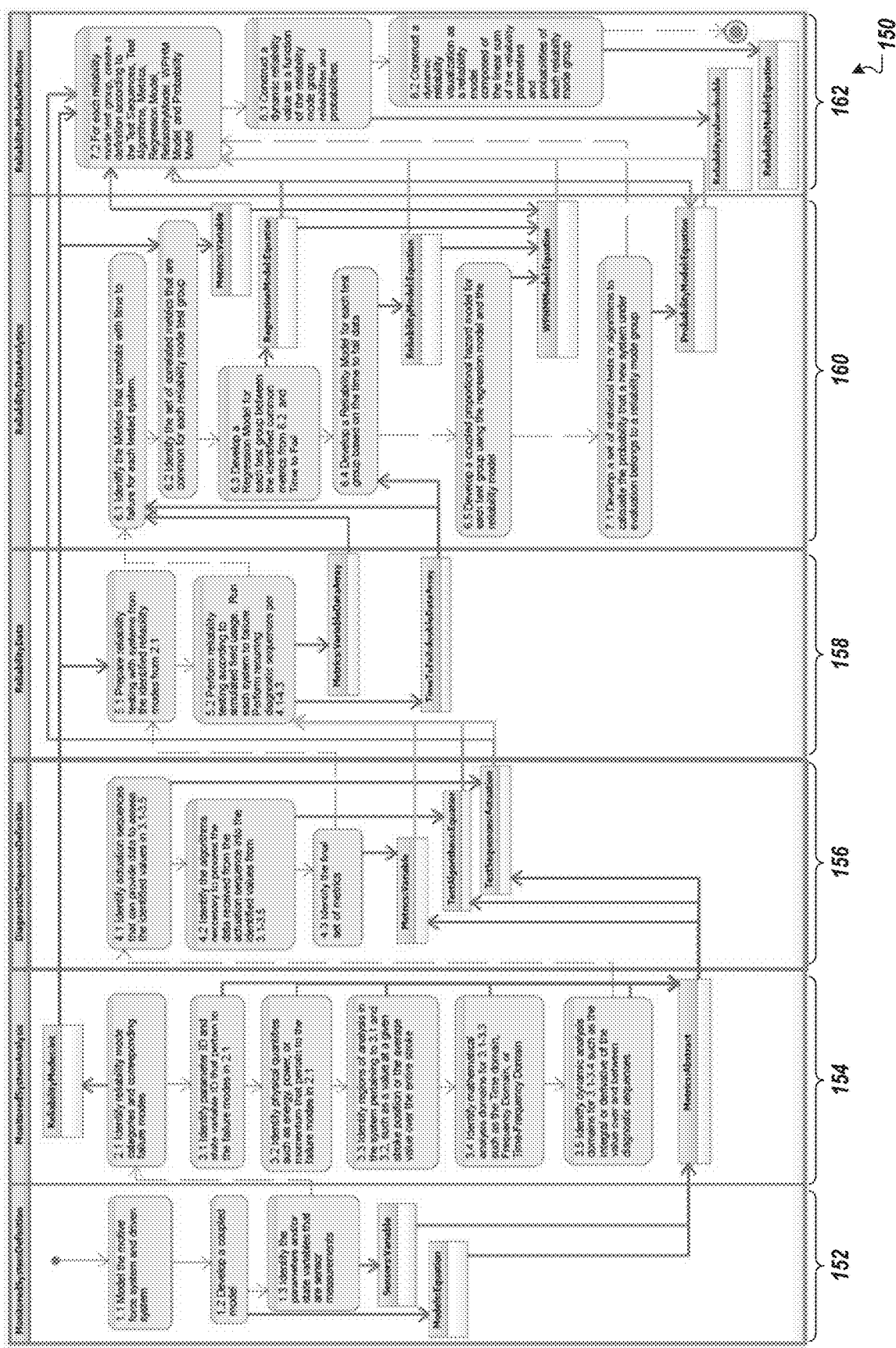
FIG. 1C is an activity diagram representing an example implementation method of a system for predicting electromechanical actuator health and remaining life, according to an implementation of the present disclosure.

FIG. 1C is an activity diagram representing an example implementation method of a system 150 for predicting electromechanical actuator health and remaining life, according to an implementation of the present disclosure. The system 150 can be the same system as the system 120, for example. The system 150 includes monitored system definition processes 152 that can include processes for setting up models and identifying corresponding parameters. Monitored system analysis processes 154 can include processes for identifying reliability mode categories and other information for monitoring the system. Diagnostic sequence definition processes 156 can include processes for defining sequences and parameters for performing the diagnostics on the system. Reliability data processes 158 can include processes for preparing and performing the testing. Reliability data analytics processes 160 can include processes for identifying, capturing, and analyzing analytics. Reliability model definitions processes 162 can include processes for constructing reliability values and constructing dynamic reliability visualizations. The systems 120 and 150 can be used in implementation of the following steps.

In Step 1, models can be built for each of the driven system and the source of the motive force. The two models can be used to build a coupled model. Each model can be composed of parameters and state variables. The subset of parameters and state variables can be identified that can be measured by the available sensors.

In an example, the coupled system can be represented in a simplified form by joining the inertia terms, viscous friction terms, and Coulomb friction terms together into one term respectively (e.g., $B_a+B_m=B$). Examples of a driven mechanical model, a motive force model, a coupled model, parameters, state variables, and a set of sensor measurements are provided. The driven mechanical model can be given by:

$$T_e = J\ddot{\theta} + B\dot{\theta} + K\theta + f \quad (1)$$

The motive force model can be given by:

$$I_{qs} = \left(\frac{1}{L_{ss}}\right)(V_{qs} - r_s I_{qs} - \omega_e L_{ss} I_{ds} - \omega_e \lambda_m) \quad (2)$$

$$I_{ds} = \left(\frac{1}{L_{ss}}\right)(\omega_e L_{ss} I_{qs} - r_s I_{ds}) \quad (3)$$

$$\omega_e = \left(\frac{P}{2}\right)\dot{\theta} \quad (4)$$

$$T_e = 3\lambda_m I_{qs} \quad (5)$$

The coupled model can be given by:

$$3\lambda_m I_{qs} = J\ddot{\theta} + B\dot{\theta} + K\theta + f \quad (6)$$

Parameters can include J, B, K, f, $r_s$, $L_{ss}$, $\lambda_m$, and P, where J is the total rotational inertia of the system, B is the total viscous friction and windage in the system, K is the spring constant of the safety return spring, f is the total Coulomb friction in the system, $r_s$ is the motor coil resistance, $L_{ss}$ is the motor coil inductance, $\lambda_m$ is the magnet torque constant, and P is the number of magnet poles.

State variables can include $\ddot{\theta}$, $\dot{\theta}$, $\theta$, $I_{qs}$, $v_{qs}$, $I_{ds}$, $\omega_e$, $T_e$, and t, where $\ddot{\theta}$ is the angular acceleration, $\dot{\theta}$ is the angular velocity, $\theta$ is the angular position, $I_{qs}$ is the quadrature current from the perspective of the rotor, $V_{qs}$ is the quadrature voltage from the perspective of the rotor, $I_{ds}$ is the direct current from the perspective of the rotor, $\omega_e$ is the electrical angular velocity, $T_e$ is the electric torque, and t is time.

A set of sensor measurements can include the following state variables defined above: $\theta$, $I_{qs}$, $V_{qs}$, $I_{ds}$, and t.

FIGS. 2A-2E are graphs showing expected dynamic responses for a constant voltage and a constant speed input corresponding to modeling of the example systems described above. For example, models can be used to identify metrics and predict system behavior in order to assess the effects of failure-modes identified in later steps and to formulate test sequences and data manipulation strategies.

Figure 2A:
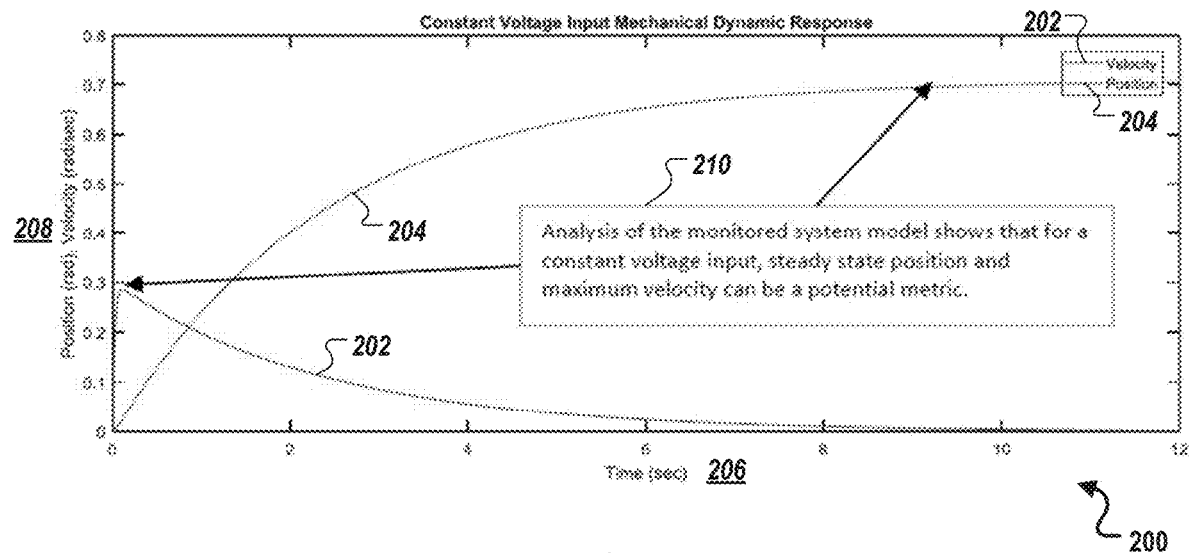
FIG. 2A is a graph showing a model plot of expected mechanical dynamics for the system with a constant voltage input per Actuation Sequence 1 (AS1), according to an implementation of the present disclosure.

FIG. 2A is a graph 200 showing a model plot of expected mechanical dynamics for the system with a constant voltage input per Actuation Sequence 1 (AS1), according to an implementation of the present disclosure. The graph 200 includes a velocity plot 202 and a position plot 204 that are plotted relative to an X-axis of time 206. A Y-axis 208 corresponds to velocity and position values of the velocity plot 202 and the position plot 204, respectively. An analysis result 210 of the monitored system model can show that, for a constant voltage input, steady state position and maximum velocity can be a potential metric.

Figure 2B:
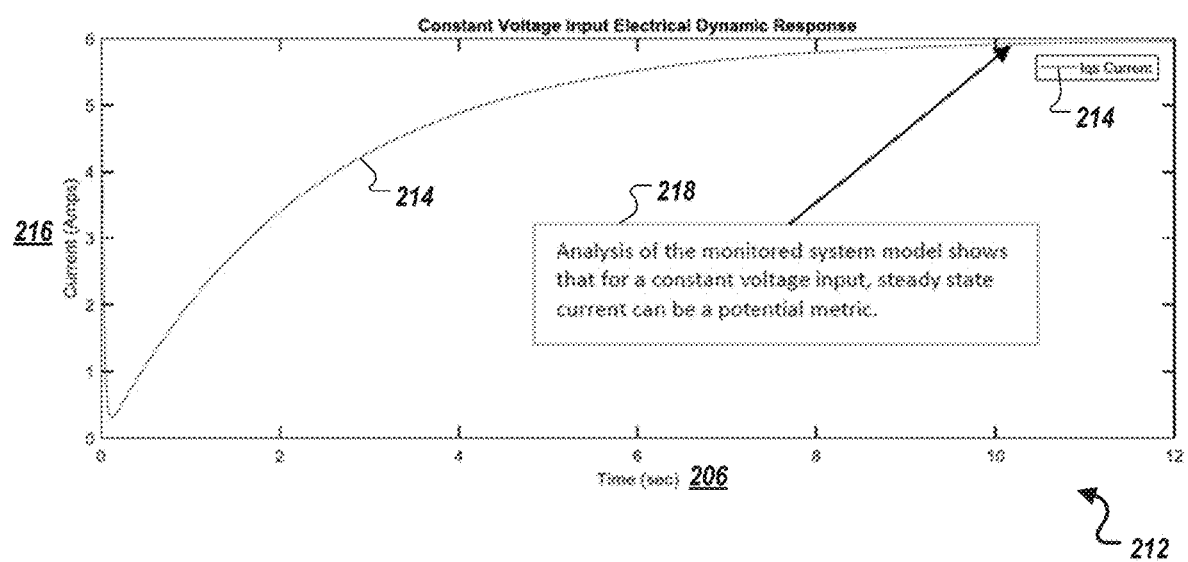
FIG. 2B is a graph showing a model plot of expected electrical dynamics for the system with a constant voltage input per AS1, according to an implementation of the present disclosure.

FIG. 2B is a graph 212 showing a model plot of expected electrical dynamics for the system with a constant voltage input per AS1, according to an implementation of the present disclosure. The graph 212 includes a current plot 214 that is plotted relative to an X-axis of time 206 and a Y-axis 208 of current 216. An analysis result 218 can show that, for a constant voltage input, steady state current can be a potential metric.

Figure 2C:
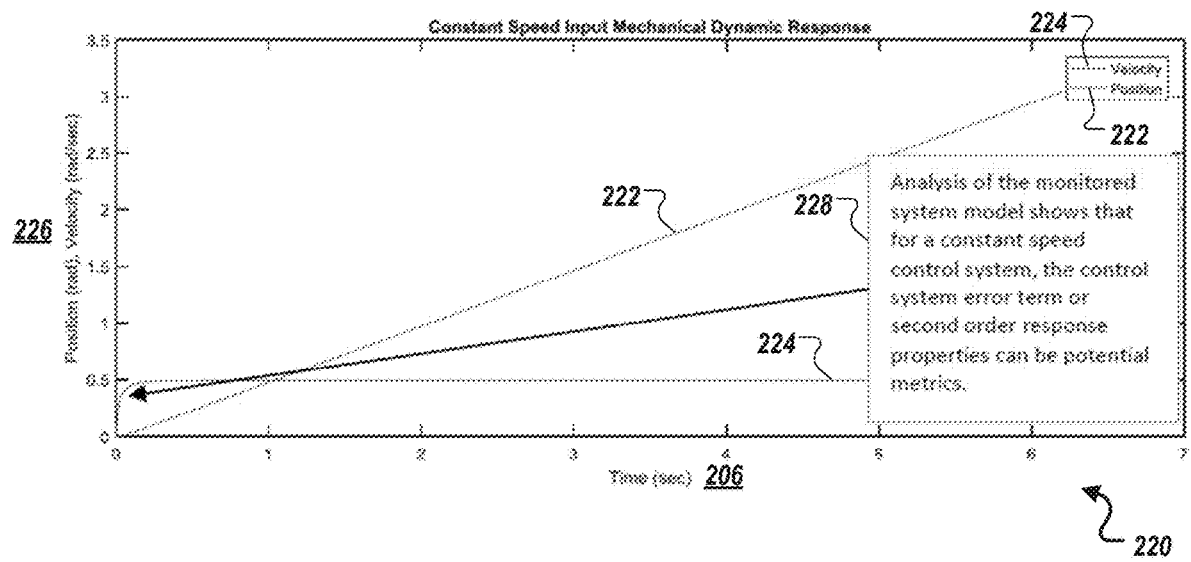
FIG. 2C is a graph showing a model plot of expected mechanical dynamics for the system with a constant speed input per Actuation Sequence 2 (AS2), according to an implementation of the present disclosure.

FIG. 2C is a graph 220 showing a model plot of expected mechanical dynamics for the system with a constant speed input per Actuation Sequence 2 (AS2), according to an implementation of the present disclosure. The graph 220 includes a position plot 222 and a velocity plot 224 that are plotted relative to an X-axis of time 206. A Y-axis 226 corresponds to position and velocity values of the position plot 222 and velocity plot 224, respectively. An analysis result 228 can show that, for a constant speed control system, the control system error term or second order response properties can be potential metrics.

Figure 2D:
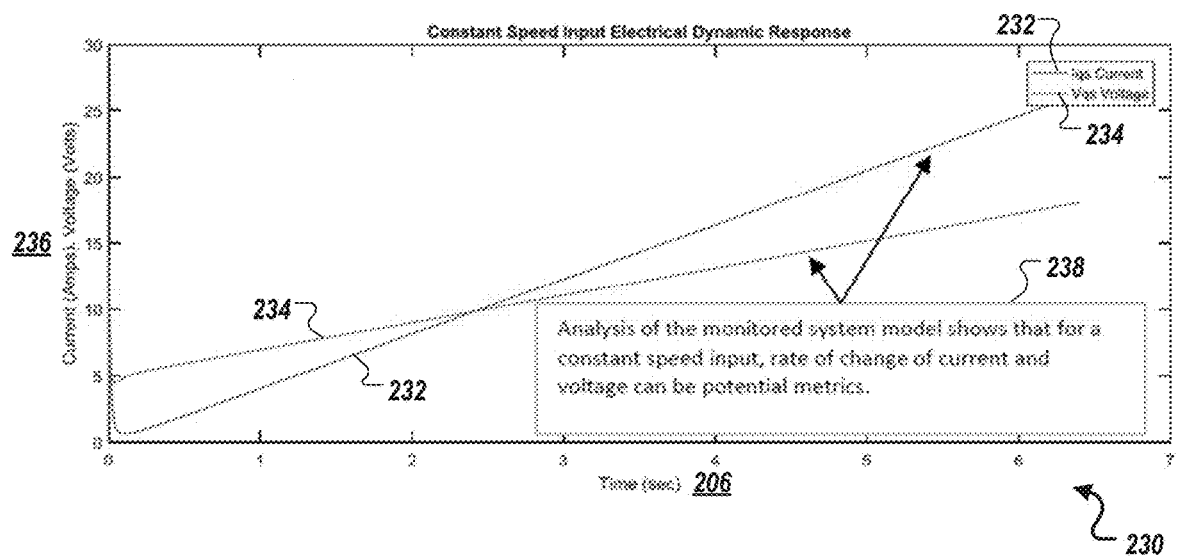
FIG. 2D is a graph showing a model plot of expected electrical dynamics for the system with a constant speed input per AS2, according to an implementation of the present disclosure.

FIG. 2D is a graph 230 showing a model plot of expected electrical dynamics for the system with a constant speed input per AS2, according to an implementation of the present disclosure. The graph 230 includes a current plot 232 and a voltage plot 234 that are plotted relative to an X-axis of time 206. A Y-axis 236 corresponds to current and voltage values of the current plot 232 and voltage plot 234, respectively. An analysis result 238 can show that, for a constant speed input, rates of change of current and voltage can be potential metrics.

Figure 2E:
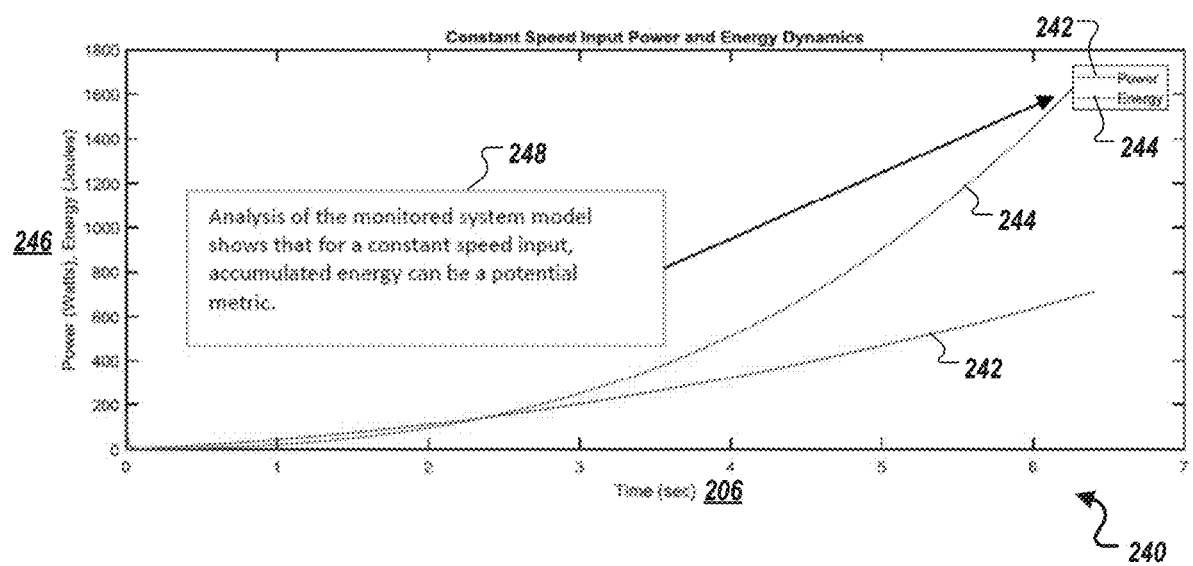
FIG. 2E is a graph showing a model plot of expected power and energy consumption dynamics for the system with a constant speed input per AS2, according to an implementation of the present disclosure.

FIG. 2E is a graph 240 showing a model plot of expected power and energy consumption dynamics for the system with a constant speed input per AS2, according to an implementation of the present disclosure. The graph 240 includes a power plot 242 and an energy plot 244 that are plotted relative to an X-axis of time 206. A Y-axis 246 corresponds to power and energy values of the power plot 242 and energy plot 244, respectively. An analysis result 248 can show that, for a constant speed input, accumulated energy can be a potential metric.

In some implementations, restrictions/guidelines on the models can include specifying that the electric torque must overcome: 1) the inertia associated with angular acceleration of the valve, 2) the viscous friction of the bearings, 3) the drag as the rotor and actuator move through the air, 4) the dynamic friction associated with the sliding of relative surfaces (e.g., bearing balls on bearing housings, and the valve shaft against seals), 5) the spring force opposing the motion of the actuator and 6) the load applied to the valve by the working fluid.

In Step 2, categories of operation, called operational reliability modes, can be identified that would likely appear as independent reliability models with corresponding failure-modes. The categories can include, for example, the following categories. A normal operation category, for example, can include known good systems that operate according to design expectations. An accelerated wear category, for example, can include known good systems operating under one or more elevated wear conditions (e.g., high actuator load, and extreme thermal environments). A non-conforming components category, for example, can include systems that include at least one piece part that is built outside specifications. The non-conforming components category can include systems in which a combination of parts are built to the extreme edge of tolerance. A failure injection category, for example, can include previously-described systems that undergo a sudden change and can induce a near-term failure. Failures can include, for example, physical damage to the system, an introduction of a severe operating environment, or a change to a highly-abrasive or corrosive working fluid. Other categories can be determined and defined by engineering judgement, by analysis of failures through a structured tool such as failure modes and effects analysis (FMEA), by analysis of field returns, or by an analysis of end-user complaints.

In an example, two operational reliability modes are used, including the set of systems experiencing normal wear and the set of systems experiencing special-cause failures arising from elevated system friction. The second mode can be identified from analysis of field returns or end-user complaints.

In Step 3, for each expected operational reliability mode category and failure mode from Step 2, and according to the models developed in Step 1, a set of measurable operating characteristics or properties can be identified that can be used to identify whether a system belongs to a given category. The measurements can characterize reliability degradation over time. Adjustments to the model in Step 1 may be necessary as determined by the identified failure-mode(s). These characteristics or properties can be organized as: 1) the parameters or state variables from the model; 2) physical quantities associated with the coupled model (e.g., power, energy, momentum, and impulse); 3) the evaluated system operating region of interest (e.g., instantaneous value at a given stroke position or a sum over a region of stroke); 4) the mathematical analysis domain (e.g., time domain, frequency domain, time-frequency domain); and 5) dynamic analysis domains (e.g., the magnitude of a metric at each diagnostic, the rate of change of the metric at each diagnostic, and the sum of magnitudes up to a given diagnostic).

Figure 3A:
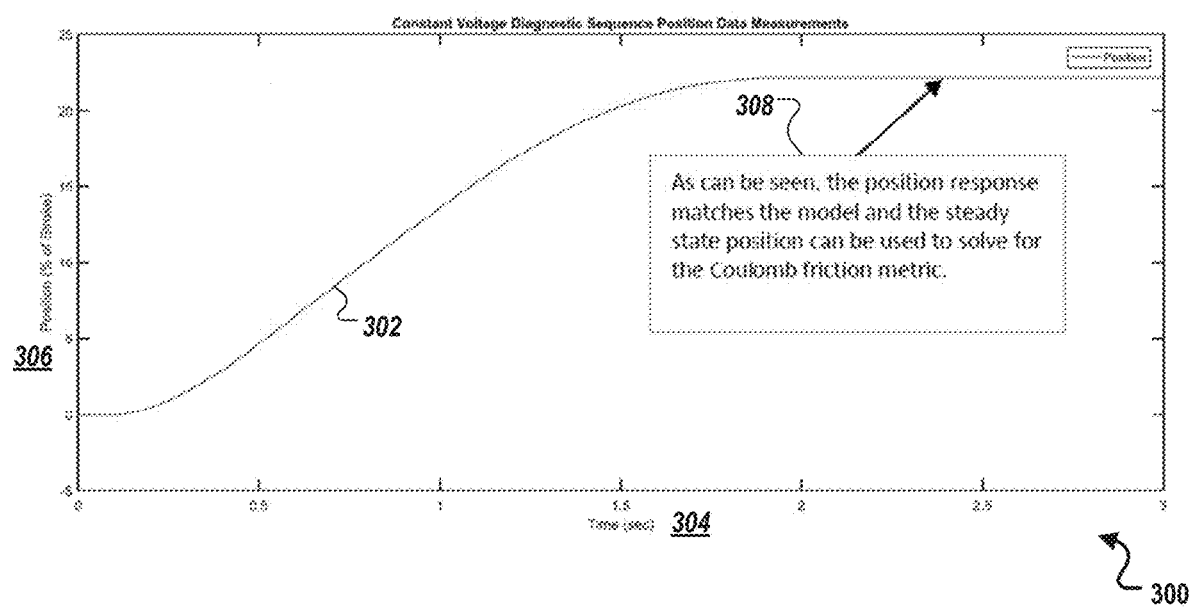
FIG. 3A is a graph showing an example diagnostic sequence plot of position versus time per AS1 for a constant voltage input, according to an implementation of the present disclosure.

FIG. 3A is a graph 300 showing an example diagnostic sequence plot of position versus time per AS1 for a constant voltage input, according to an implementation of the present disclosure. The steady state position that results from the constant current input can be sufficient to solve for one identified reliability metric. The graph 300 includes a position plot 302 that is plotted relative to an X-axis of time 304. A Y-axis 306 corresponds to position values of the position plot 302. An analysis result 308 can show that the position response matches the model and that the steady state position can be used to solve for the Coulomb friction metric.

Figure 3B:
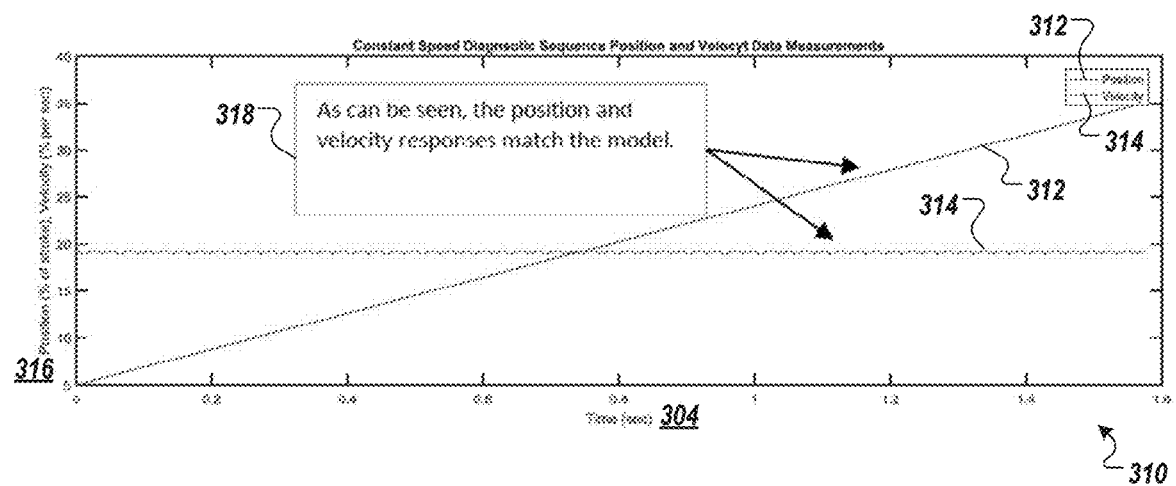
FIG. 3B is a graph showing a second example diagnostic sequence plot per AS2 of position and velocity versus time for a constant velocity input, according to an implementation of the present disclosure.

FIG. 3B is a graph 310 showing a second example diagnostic sequence plot per AS2 of position and velocity versus time for a constant velocity input, according to an implementation of the present disclosure. The graph 310 includes a position plot 312 and a velocity plot 314 that are plotted relative to an X-axis of time 304. A Y-axis 316 corresponds to position and velocity values of the plots 312 and 314, respectively. An analysis result 318 can show that the position and velocity responses match the model.

Figure 3C:
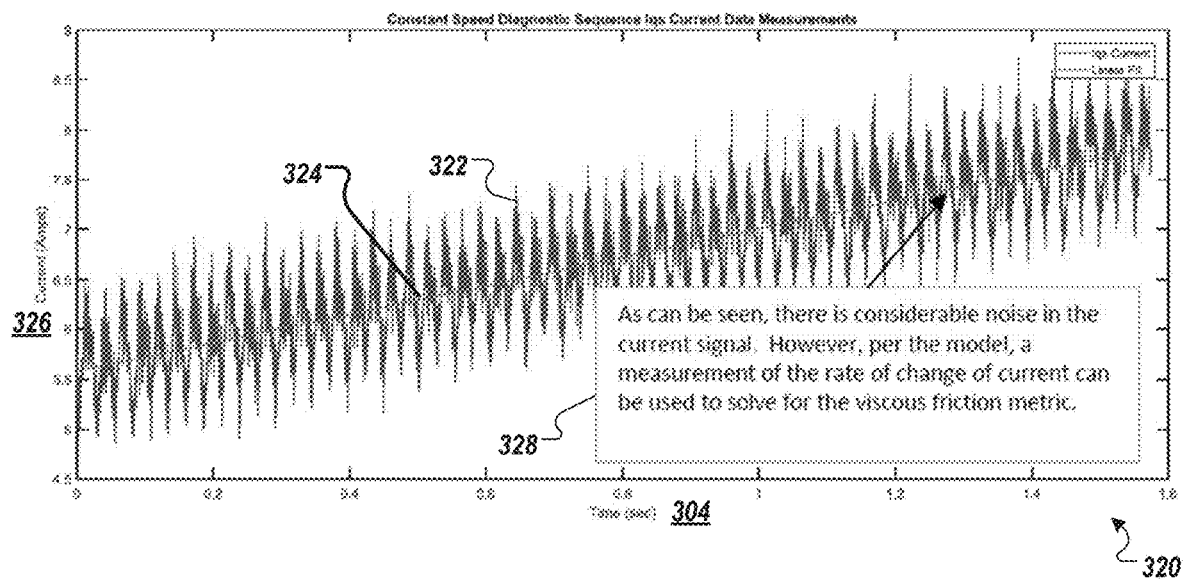
FIG. 3C is a graph showing a plot of the current sent to the motor to achieve the response shown in FIG. 3B, according to an implementation of the present disclosure.

FIG. 3C is a graph 320 showing a plot of the current sent to the motor to achieve the response shown in FIG. 3B, according to an implementation of the present disclosure. The slope of the response can be sufficient to solve for one identified reliability metric. The graph 320 includes a current plot 322 and a linear fit line 324 that are plotted relative to an X-axis of time 304. A Y-axis 326 corresponds to current values of the plot 322 and 324. An analysis result 328 can show that there is considerable noise in the current signal. However, using the model, a measurement of the rate of change of current can be used to solve for the viscous friction metric.

Figure 3D:
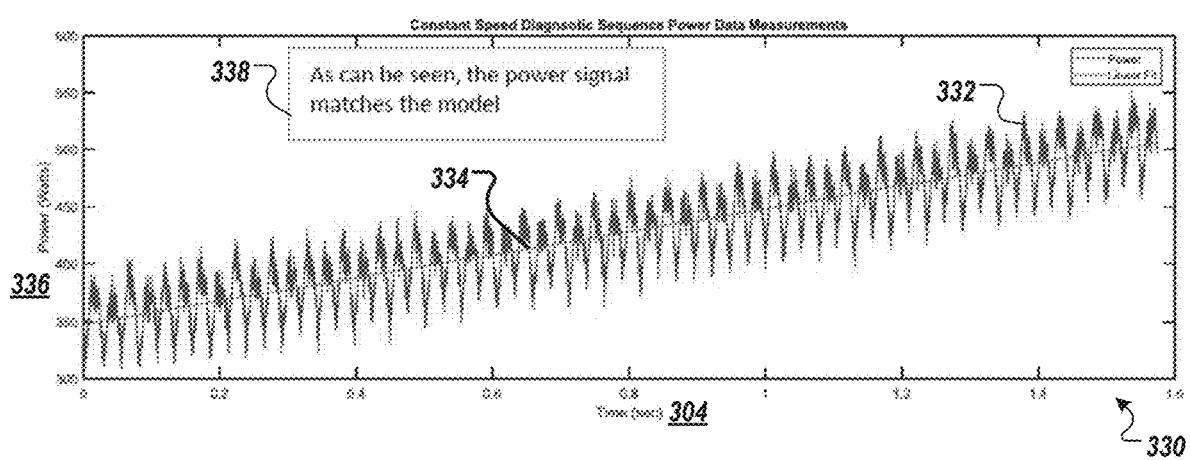
FIG. 3D is a graph showing a plot of the power provided to the motor to achieve the response shown in FIG. 3B, according to an implementation of the present disclosure.

FIG. 3D is a graph 330 showing a plot of the power provided to the motor to achieve the response shown in FIG. 3B, according to an implementation of the present disclosure. The graph 330 includes a power plot 332 and a linear fit line 334 that are plotted relative to an X-axis of time 304. A Y-axis 336 corresponds to power values of the plots 332 and 334. An analysis result 338 can show that the power signal matches the model.

Figure 3E:
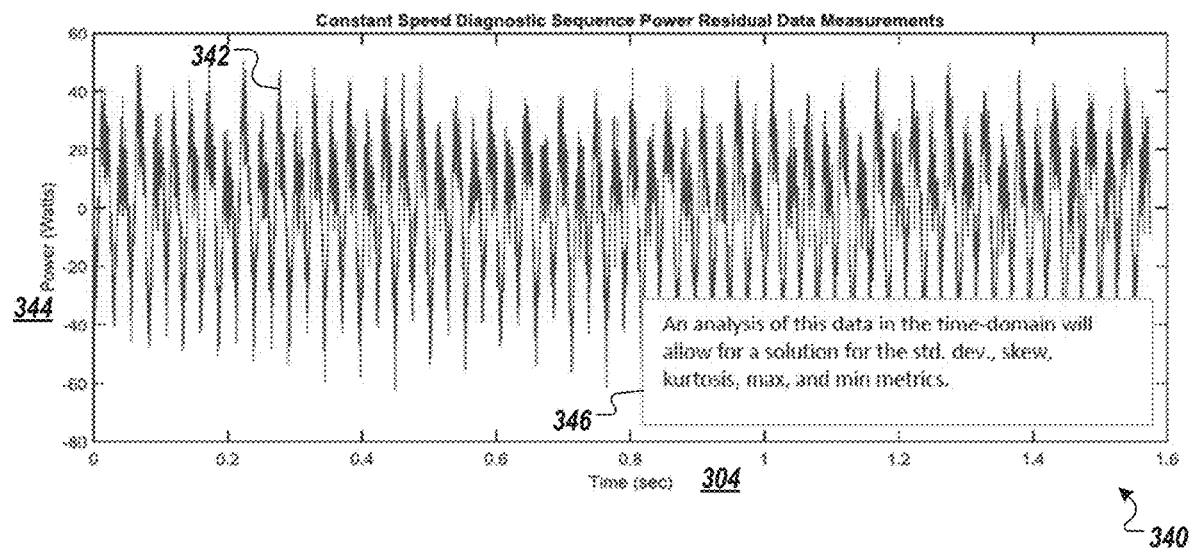
FIG. 3E is a graph showing a plot of the linear fit residuals of the power provided to the motor to achieve the response shown in FIG. 3B, according to an implementation of the present disclosure.

FIG. 3E is a graph 340 showing a plot of the linear fit residuals of the power provided to the motor to achieve the response shown in FIG. 3B, according to an implementation of the present disclosure. An analysis of this plot and data can be sufficient to solve for several identified time-domain reliability metrics. The graph 340 includes a power plot 342 that is plotted relative to an X-axis of time 304. A Y-axis 344 corresponds to power values of the plot 342. An analysis result 346 can show that an analysis of this data in the time-domain can allow for a solution for the standard deviation, skew, kurtosis, maximum, and minimum metrics.

Figure 3F:
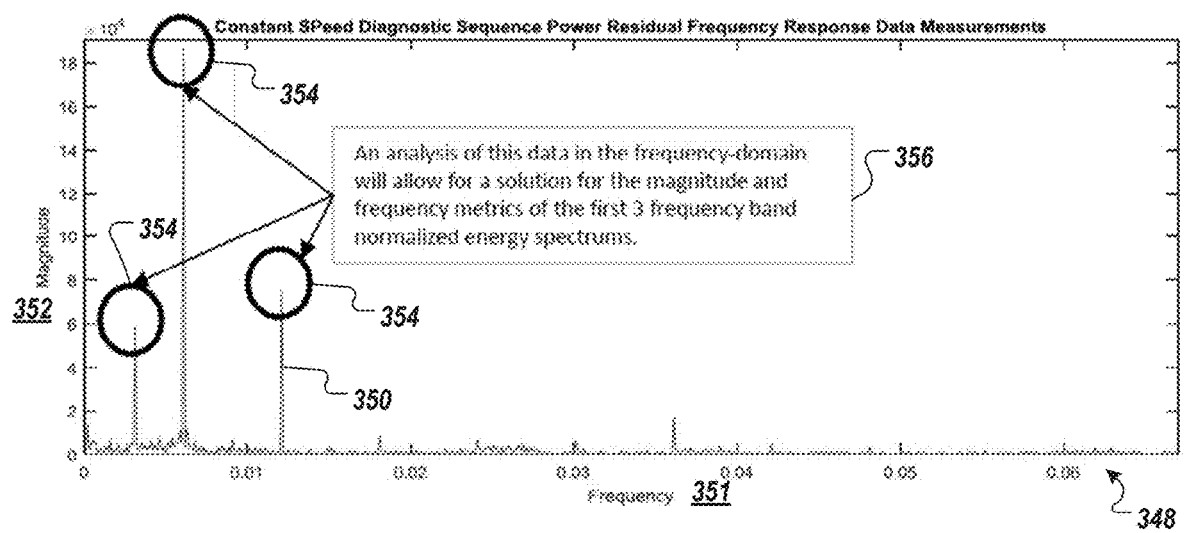
FIG. 3F is a graph showing a plot of the frequency response of the linear fit residuals of the power provided to the motor to achieve the response shown in FIG. 3B, according to an implementation of the present disclosure.

FIG. 3F is a graph 348 showing a plot of the frequency response of the linear fit residuals of the power provided to the motor to achieve the response shown in FIG. 3B, according to an implementation of the present disclosure. An analysis of this plot and data can be sufficient to solve for several identified frequency-domain reliability metrics. The graph 348 includes a magnitude plot 350 that is plotted relative to an X-axis of time 304 and a Y-axis 352 of magnitude. Circles 354 identify peaks in the magnitude plot 350. An analysis result 348 indicates that an analysis of the data in the frequency-domain can allow for a solution for the magnitude and frequency metrics of the first three frequency band normalized energy spectrums.

Figure 3G:
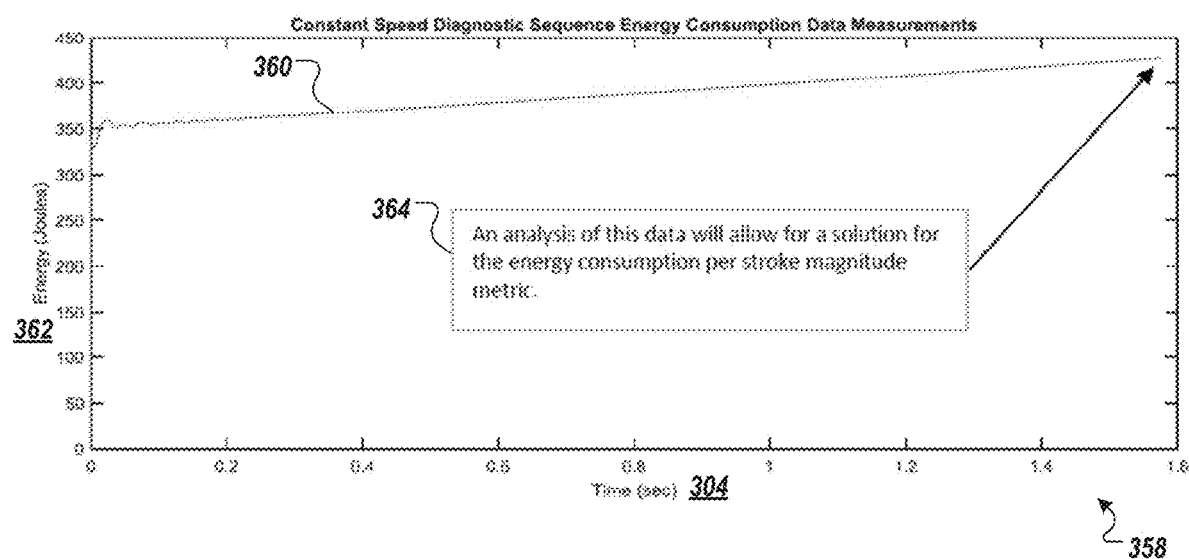
FIG. 3G is a graph showing a plot of the accumulated energy consumption of the power provided to the motor to achieve the response shown in FIG. 3B, according to an implementation of the present disclosure.

FIG. 3G is a graph 358 showing a plot of the accumulated energy consumption of the power provided to the motor to achieve the response shown in FIG. 3B, according to an implementation of the present disclosure. An analysis of this plot and data is sufficient to solve for an identified reliability metric. The graph 358 includes an energy plot 360 that is plotted relative to an X-axis of time 304 and a Y-axis of energy 362. An analysis result 318 can show that an analysis of the data can allow for a solution for the energy consumption in relation to stroke magnitude metric.

In an example, a special-cause failure arising from elevated system friction can occur. The failure-mode can indicate, for example, physical damage to the motor housing resulting in a violation of ingress protection and subsequent corrosion of internal components. In Failure Mode 1, for example, corrosion of the bearings and rotor can increase the values of the viscous friction and windage term B and the Coulomb friction term f from the coupled mechanical model. In Failure Mode 2, for example, corrosion of the coils can decrease the value of $L_{ss}$ from the motor electrical model. The values of B, f, and $L_{ss}$ can be evaluated as an average value over the entire stroke of operation. Over time and between diagnostic sequences, the absolute value of B, f, and $L_{ss}$ can be of interest.

In an example, both Failure Mode 1 and 2 can result in a change in the physical requirement of the closed loop control system, leading to an overall increase in power consumption as well as other forms of unusual variation in the power signal. Thus, total energy consumed over a cycle can be of interest, as can be the time and frequency properties of the distribution of instantaneous power within each stroke. Over time and between diagnostic sequences, the absolute value of the instantaneous power properties can be of interest. Over time and between diagnostic sequences, instances of elevated energy consumption can indicate elevated friction. The special-cause failure mode can suggest that instances of elevated friction can occur in a cascading sequence, thus the relevance of a high energy measurement to predicting the special cause failure mode can be proportional to the proximity of high energy measurement in time. Furthermore, the accumulation and rate of change of the scaled elevated energy measurements can be indicative of the special-cause failure mode.

In Step 4, a set of actuation sequences can be developed that can provide data that can be manipulated and analyzed in order to identify metrics corresponding with the operating characteristics and properties from Step 3. These metrics can be the metrics that correlate with time to failure and system degradation. The identified operating properties and characteristics from Step 3 can be expanded upon according to a variety of verification and validation techniques. The dynamics of each category and failure mode scenario can be modeled to show expected behavior and signal magnitude changes. An accounting can be made for the error and inherent stochastic noise of the signal and from operating conditions. Changes in measurements acquired from selected actuation sequences can be expected to indicate the category and failure mode. Other verification and validation activities can be performed, and additional metrics can be developed according to engineering judgment and failure mode analysis.

In an example, selected actuation sequences can provide information that can identify the values of B, f, and $L_{ss}$ in the model at a given point in time. Similarly, selected actuation sequences can be used to assess the power and energy consumption of the system under repeatable, controlled conditions. Actuation sequences can be made that supply values to the motor in an offline diagnostic. The data collected can be manipulated to solve for relevant metrics identified in Step 3.

In an example, Actuation Sequence 1 (AS1) can supply a constant voltage, Vqs to the motor. With foreknowledge of the magnet torque constant, $\lambda_m$, and the spring constant, K, measurements of the steady state current $I_{qsSS}$ and steady state actuator position, $\theta_{SS}$, can be used to solve for the coupled system friction term f as shown in Equation (7). See FIG. 3A for an example of AS1 for an example system similar to the one modeled in Step 1. Thus, to extract the metric f from the system, AS1 must be run, $I_{qsSS}$ and $\theta_{ss}$ measured, and Equation (7) calculated according to stored values of $\lambda_m$ and K.

$$f = 3\lambda_m I_{qsSS} - K\theta_{SS} \tag{7}$$

In an example, Actuation Sequence 2 (AS2), can use a control system to force a constant speed and can measure the $L_{qs}$ current, $I_{ds}$ current, and instantaneous power P along the length of stroke, as well as the total energy, E, consumed over the length of the stroke. The $I_{qs}$ and, $I_{ds}$ current values can be used to solve for B and $L_{ss}$ in the model. Given foreknowledge of K and f from AS1, coupled with measurements of the rate of change of the $L_{qs}$ current and the rate of change of the actuator position $\theta$, B can be solved according to Equation (8). See FIG. 3B for an example of AS2 for an example system similar to the one modeled in Step 1. Similarly, with knowledge of the speed setting, electrical angular velocity, $\omega_e$, and foreknowledge of the coil resistance $r_s$, coupled with measurements of the average $I_{qsavg}$ and $I_{dsavg}$ current over the length of stroke, $L_{ss}$ can be solved according to Equation (9). See FIG. 3C for an example of AS2 for an example system similar to the one modeled in Step 1. Thus, to extract the metric B and $L_{ss}$ from the system, AS2 must be run, $I_{qs}$, $I_{ds}$, and $\theta$ measured, and Equations (8) and (9) calculated according to stored values of $\lambda_m$, f, and K.

$$B = \left(\frac{1}{\dot{\theta}_{SS}}\right)\left(3\lambda_m \frac{d}{dt}(I_{qs}) - K\frac{d}{dt}(\theta) - f\right) \tag{8}$$

$$L_{ss} = \frac{r_s I_{dsavg}}{\omega_e I_{qsavg}} \tag{9}$$

In an example, as the rotor and bearings corrode, the stability and signal distribution properties of the instantaneous power measurement along the length of the stroke can change. The instantaneous power can be calculated using the sensor measurements of $I_{qs}$ and $V_{qs}$ according to Equation (10). The time-domain properties of the signal can be analyzed by first fitting the instantaneous signal to an expected linear response per Equation (11), where P represent the fitted instantaneous power values. The residuals, $P_{res}$, can be calculated according to Equation (12). See FIG. 3D for an example of instantaneous power consumption per AS2 for an example system similar to the one modeled in Step 1. See FIG. 3E for an example of instantaneous power consumption residuals per AS2 for an example system similar to the one modeled in Step 1.

$$P = 1.5(V_{qs} I_{qs}) \tag{10}$$

$$\hat{P} = m\theta + b \tag{11}$$

$$P_{res} = P - \hat{P} \tag{12}$$

The Residuals of this linear fit can be analyzed to determine the standard deviation, $s_{res}$, per Equation (13), the skew, $S_{res}$, per Equation (14), the kurtosis, $K_{res}$, per Equation (15), the maximum residual, $P_{resmax}$, per Equation (16), and the minimum residual, $P_{resmin}$, per Equation (17), where N is the number of instantaneous power measurements along the stroke. Thus, to extract this set of time-domain metrics, AS2 must be run, $I_{qs}$, $V_{qs}$, and $\theta$ measured, power calculated per Equation (10), a linear fit made and residuals calculated per Equations (11) and (12), and Equation (13)-(17) calculated.

$$s_{res} = \sqrt{\frac{\sum P_{res}^2}{N-1}} \quad (13)$$

$$S_{res} = \frac{N}{(N-1)(N-2)} \sqrt{\frac{\sum P_{res}^3}{s_{res}^3}} \quad (14)$$

$$K_{res} = \frac{N(N+1)}{(N-1)(N-2)(N-3)} \sqrt{\frac{\sum P_{res}^4}{s_{res}^4}} \quad (15)$$

$$P_{resmax} = \text{MAX}(P_{res}) \quad (16)$$

$$P_{resmin} = \text{MIN}(P_{res}) \quad (17)$$

In an example, the residuals of this linear fit can be analyzed by Fast Fourier Transform to determine the frequency-domain properties of the instantaneous power and to extract the magnitudes and frequencies of the first three frequency band normalized energy spectrums. See FIG. 3F for an example of instantaneous power consumption frequency decomposition per AS2 for an example system similar to the one modeled in Step 1.

In an example, the total Energy consumed over the diagnostic stroke can be calculated as the sum of the instantaneous power divided by the elapsed time per Equation (18). See FIG. 3F for an example of total energy consumption over time per AS2 for an example system similar to the one modeled in Step 1.

$$E = \frac{1}{t_2 - t_1} \int_{t_1}^{t_2} P dt \quad (18)$$

In an example, for the special-cause failure mode, AS1 and AS2 are sufficient diagnostic actuation sequences to acquire the data necessary to calculate the Metrics shown in Equations (7)-(18). For the metrics identified in equations (7)-(17), the instantaneous values at each diagnostic sequence are sufficient. Per the analysis in Step 3, the metric identified in Equation (18) can also be combined with time, integrated, and evaluated for rate of change. First, an assessment of normal operation can be performed. By identifying the stochastic nature of the system inputs that affect energy consumption over the early stages of operation, a normalized value can be attained according to Equation (19), where $E_{th}$ is an arbitrary threshold two standard deviations from the stochastic mean and $s_E$ is the standard deviation. The mean and standard deviation can be determined by the natural variation of the system in early operation, as determined by testing or active monitoring during commissioning. The Integral and Derivative values can then be solved by taking into account a value $\Delta m$, where $\Delta m$ is the elapsed time or the number of diagnostic sequences between elevated energy measurements, as defined by Equation (19). The integral of elevated energy events, $E_{int}$, is shown in Equation (20), where n=1 represents the first elevated energy measurement and m represents the current diagnostic sequence. The derivative of elevated energy events, $E_{der}$, is shown in Equation (21). Thus, a set of three additional metrics can be assessed according to the dynamics over and between diagnostic sequences.

$$E_n = \frac{E - E_{th}}{s_E} \quad (19)$$

$$E_{int} = \sum_{n=1}^{n=m} \frac{E_n}{\Delta m} \quad (20)$$

$$E_{der} = \frac{E_m - E_{m-1}}{\Delta m} \quad (21)$$

In the examples for Step 4, multiple metrics are shown that can be derived and that can indicate the wear and degradation associated with the failure mode identified in Step 2. These metrics touch on many of the analysis domains that can affect reliability. Each metric can be defined by an actuation sequence and a manipulation of the data. These results are summarized in Table 2. In practice, a larger set of metrics can be derived.

TABLE 2

Metrics

| Metric | Actuation Sequence | Data Manipulation | Equation |
|---|---|---|---|
| M1: f | AS1 | Steady State Position and Current | 7 |
| M2: B | AS2 | Rate of change of Current and Position | 8 |
| M3: Lss | AS2 | Average Iqs and Ids Current | 9 |
| M4: sres | AS2 | Power Residual Decomposition | 13 |
| M5: Sres | AS2 | Power Residual Decomposition | 14 |
| M6: Kres | AS2 | Power Residual Decomposition | 15 |
| M7: Presmax | AS2 | Power Residual Decomposition | 16 |
| M8: Presmin | AS2 | Power Residual Decomposition | 17 |
| M9: 1$^{st}$ normalized energy spectrum | AS2 | Power Residual FFT | Not Shown |
| M10: 2$^{nd}$ normalized energy spectrum | AS2 | Power Residual FFT | Not Shown |
| M11: 3$^{rd}$ normalized energy spectrum | AS2 | Power Residual FFT | Not Shown |
| M12: E | AS2 | Energy over a diagnostic sequence | 18 |
| M13: En | AS2 | ID extreme values over time | 19 |
| M14: Eint | AS2 | Integrate extreme values over time | 20 |
| M15: Eder | AS2 | Derivative extreme values over time | 21 |

In Step 5, reliability testing can be performed on a set of systems for each category identified in Step 2, and a full set of offline diagnostics can be performed at a consistent and high rate. Each offline diagnostic can be composed of the actuation sequences, algorithms, and metric calculations identified in Step 4. Each system can be run to failure and the time to failure recorded. The diagnostic sequence monitored values can be stored in a row vector $x_{m,n}$, where m is an integer representing the diagnostic sequence instance, and n is the set of metrics identified in Step 4. An evaluation of the confidence of each reliability model as determined by the sample size can be performed.

Figure 4A:
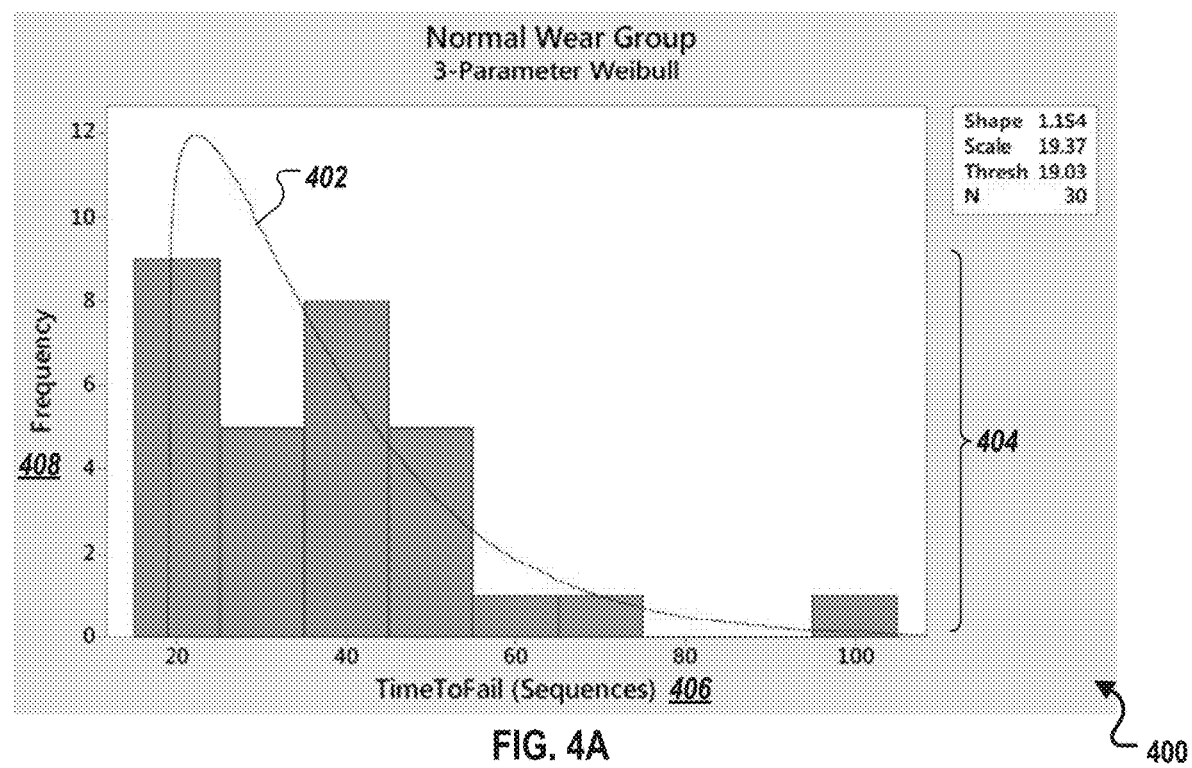
FIG. 4A is a graph showing an example of a histogram of times-to-failure for a Reliability Mode group, according to an implementation of the present disclosure.
Figure 4B:
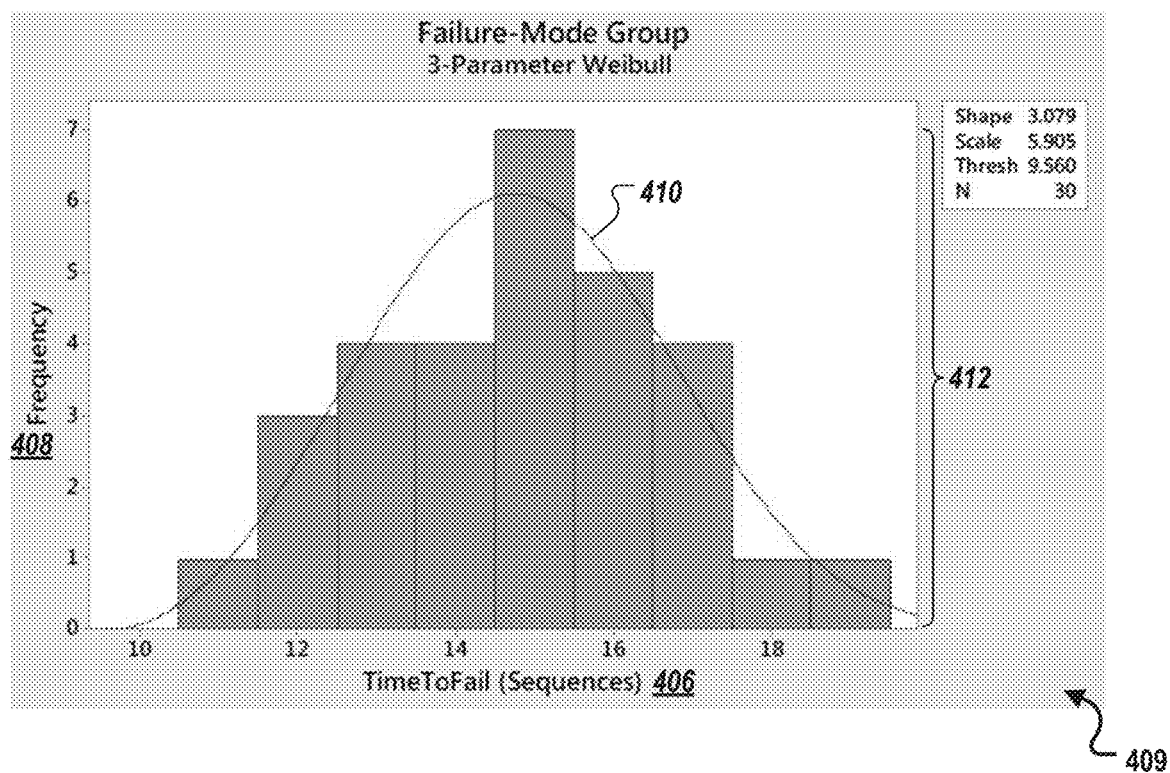
FIG. 4B is a graph showing an example of a histogram of times-to-failure for a Reliability Mode group, according to an implementation of the present disclosure.

In an example, for an application in which the valve is in dynamic operation for only a brief portion of each day, the reliability testing can consist of a recurring actuation sequence that simulates the daily demand on the valve. An offline diagnostic sequence can be performed once per simulated day. In an example, the categories for each reliability group can include normal wear and the special-cause failure mode identified in Step 2. In the row vector $x_{m,n}$, m represents each simulated day. FIGS. 4A and 4B show example time to fail histograms for a group of normal-wear units and a group of special-cause failure units.

FIG. 4A is a graph 400 showing an example of a histogram of times-to-failure for a Reliability Mode group, according to an implementation of the present disclosure. This data can be sufficient to solve for the parameters of the group's reliability model. Observed frequency of times-to-failure values 404 are shown to approximate a linear fit line 402. The times-to-failure values 404 are represented as a histogram plotted relative to an X-axis of time 406 and a Y-axis of frequency 408.

FIG. 4B is a graph 409 showing an example of a histogram of times-to-failure for a Reliability Mode group, according to an implementation of the present disclosure. This data can be sufficient to solve for the parameters of the group's reliability model. Observed frequency of times-to-failure values 412 are shown to approximate a linear fit line 414. The times-to-failure values 412 are represented as a histogram plotted relative to an X-axis of time 406 and a Y-axis of frequency 408.

In Step 6, a statistical method such as KPCA can be used to identify those metrics that best correlate with time to failure from the row vector $x_{m,n}$ for each unit tested. The results of reliability testing in Step 5 can be used to identify the minimum set of n metrics ($\lambda_n$) that best correlate with time and sufficiently describe the degradation of each system in each category. The set of measurements and metrics (e.g., $\lambda_{Cn}$) can be identified that are common across all the systems in the same category. The metrics can be used as the covariates in a parametric regression of a Weibull Proportional Hazard Model for each category. The hazard rate for each category can then be written according to Equation (22), where $h_{CO}(t)$ is the baseline hazard rate for category C, $x_{m,n}$ is a row vector of measurements, and $\xi_{Cn}$ is the regression parameter(s) for the common set of metrics (e.g., $\lambda_{Cn}$) that describe each category. The hazard rate can be given by Equation (22):

$$h_C(t, x_{m,n}) = h_{CO}(t) \cdot e^{(\xi_{Cn} \cdot x_{m,n})} \quad (22)$$

where $$h_{C0}(t) = \frac{\beta_C}{\eta_C} \left( \frac{t - \gamma_C}{\eta_C} \right)^{\beta_C - 1},$$

$\beta$ is a shape parameter, $\eta$ is a scale parameter, and $\gamma$ is a threshold parameter.

In an example, it is found that metric M14 from Table 2 is the only metric that strongly correlates with time to failure for the failure-mode group. It is found that metric M4 from Table 2 is the only metric that strongly correlates with time to failure for the normal-wear group. In each case, these metrics do not correlate with time for the opposing group. An example plot of these correlated relationship with time is shown in FIGS. 5A-5B.

Figure 5A:
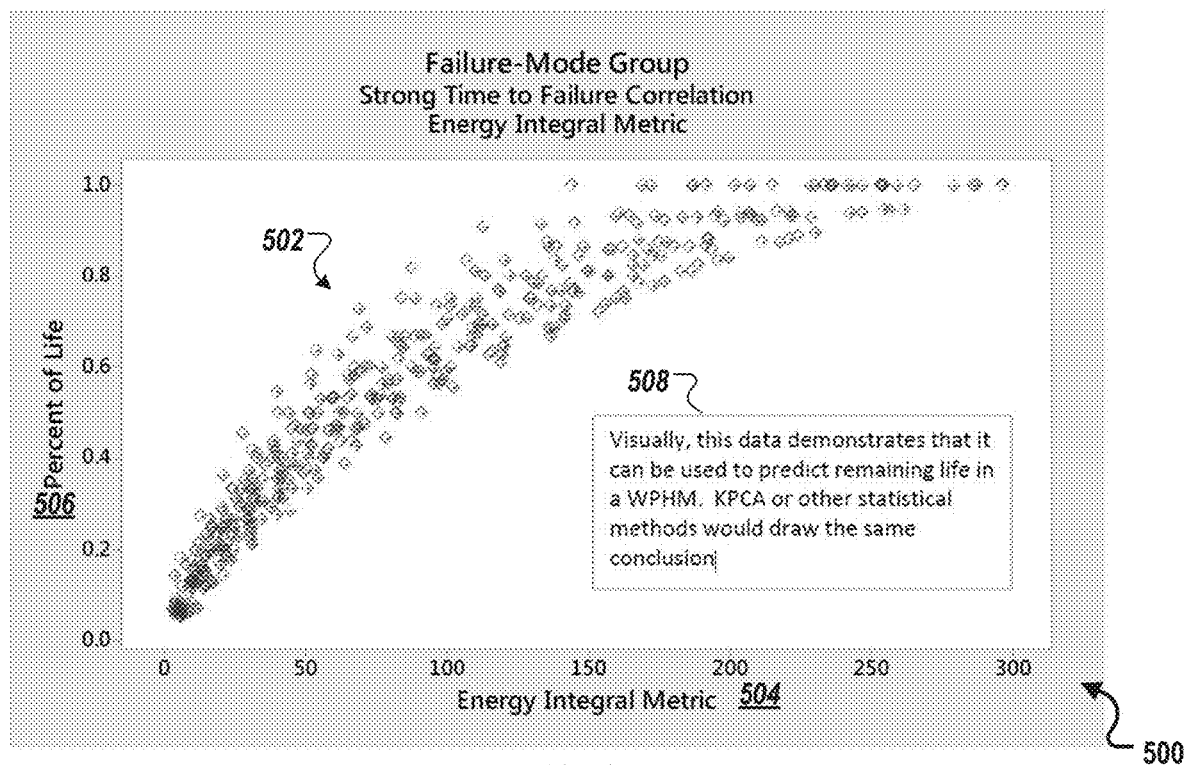
FIG. 5A is a graph showing an example of a plot of a Reliability Metric that is strongly correlated with time to failure for a Reliability Mode group, according to an implementation of the present disclosure.

FIG. 5A is a graph 500 showing an example of a plot of a Reliability Metric that is strongly correlated with time to failure for a Reliability Mode group, according to an implementation of the present disclosure. This data can be sufficient to solve for a regression model for this Reliability Mode group. The graph 500 includes a scatter plot 502 of percent of life values 506 relative to an energy integral metric 504. An analysis result 508 can indicate that, visually, the data demonstrates that it can be used to predict remaining life in a WPHM. KPCA or other statistical methods can also draw the same conclusion.

Figure 5B:
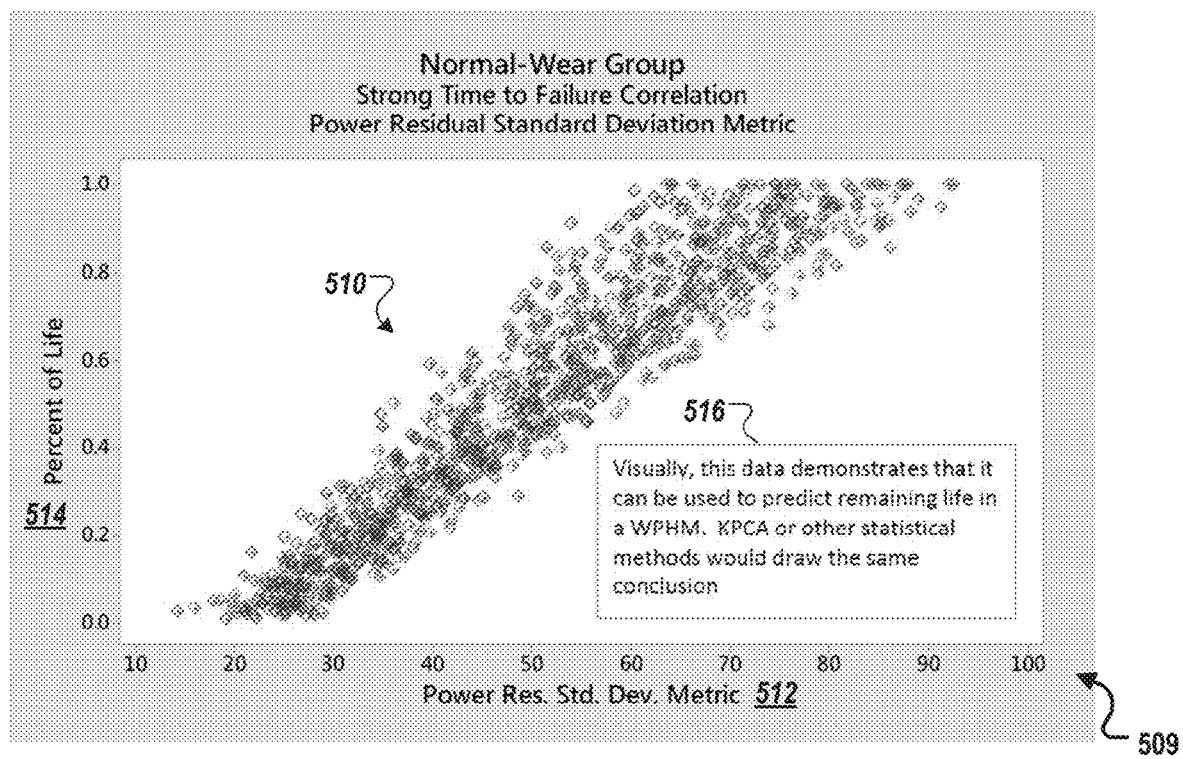
FIG. 5B is a graph showing an example of a plot of a Reliability Metric that is strongly correlated with time to failure for a Reliability Mode group, according to an implementation of the present disclosure.

FIG. 5B is a graph 509 showing an example of a plot of a Reliability Metric that is strongly correlated with time to failure for a Reliability Mode group, according to an implementation of the present disclosure. This data can be sufficient to solve for a regression model for this Reliability Mode group. The graph 509 includes a scatter plot 510 of percent of life values 514 relative to a power residual standard deviation metric 504. An analysis result 516 can indicate that, visually, the data demonstrates that it can be used to predict remaining life in a WPHM. KPCA or other statistical methods would draw the same conclusion.

The Weibull model of the normal-wear and failure-mode groups can be found using the maximum likelihood method. The normal wear reliability model is shown in Equation (23). The failure-mode reliability model is shown in Equation (24). The regression model for the failure-mode group is shown in Equation (25). The regression model for the normal-wear group is shown in Equation (26).

$$R_{normal} = e^{-\frac{t - 19.03}{19.37}^{1.154}} \quad (23)$$

$$R_{failure} = e^{-\frac{t - 9.560}{5.905}^{3.079}} \quad (24)$$

$$L_{failure} = 1 - .0302(M14)^{.6584} \quad (25)$$

$$L_{normal} = 1 - .0165(M4) + .2955 \quad (26)$$

In Step 7, for each $\lambda_{Cn}$ set from Step 6, a set of statistical tests and algorithms $F_C(t, x_{m,n}, \lambda_{Cn}, x_{m,n}')$, where $x_{m,n}'$ is the set of newly measured data for a system under evaluation, can be built that can dynamically assess the degree to which measurements on a new system undergoing the offline diagnostic from Step 5 belong to the expected behavior of the metric. The result can be a set of probabilities corresponding to each reliability group, as shown in Equation (27):

$$P_C = F_C(t, x_{m,n}, \lambda_{Cn}, x_{m,n}') \quad (27)$$

where:

$$\sum_{1}^{k} P_C = 1,$$

and k is the number of categories C. An evaluation of the alpha and beta errors of this probability calculation can be performed as needed based on sample size.

In an example, eleven example diagnostic sequences have been run. An ANOVA F-test that evaluates the fit of these eleven data points to the failure-mode model in Step 6 is shown and finds that it agrees with the model at an 85% confidence level. The results of this ANOVA F-test are shown in Table 3. The same test against the normal-wear model finds the data does not agree with the model at an 85% confidence level. Based on knowledge of the prior distribution of the probability that the system falls into the group given eleven points that agree with the model is known, a probability can be calculated. An example probability of 85% for the failure mode group and 15% for the normal wear group is used.

TABLE 3

Statistical Test example for Reliability Mode Group Agreement
ANOVA fit to .0302*(M14)^(.6584)

| Diag. Seq. m | Normalized Elevated Energy Ratio | Energy Integral Metric 14 | ln (m) | Ln (Metric 14) | Sxy | Sxx | ln (Fits) | SSreg |
|---|---|---|---|---|---|---|---|---|
| 1 | 1 | 1 | 0 | 0.00 | 3.59 | 1.48 | 2.39 | 5.69 |
| 2 | 3 | 4 | 0.69 | 1.39 | 0.78 | 0.28 | 2.62 | 1.52 |
| 3 | 0 | 4 | 1.1 | 1.39 | 0.43 | 0.01 | 2.85 | 2.15 |
| 4 | 0 | 4 | 1.39 | 1.39 | 0.18 | 0.03 | 3.09 | 2.89 |
| 5 | 5 | 9 | 1.61 | 2.20 | 0.00 | 0.15 | 3.32 | 1.26 |
| 6 | 7 | 16 | 1.79 | 2.77 | 0.10 | 0.33 | 3.55 | 0.61 |
| 7 | 0 | 16 | 1.95 | 2.77 | 0.18 | 0.53 | 3.78 | 1.02 |
| 8 | 5 | 21 | 2.08 | 3.04 | 0.38 | 0.74 | 4.02 | 0.95 |
| 9 | 1 | 22 | 2.2 | 3.09 | 0.50 | 0.96 | 4.25 | 1.34 |
| 10 | 4 | 26 | 2.3 | 3.26 | 0.71 | 1.18 | 4.48 | 1.50 |
| 11 | 9 | 35 | 2.4 | 3.56 | 1.05 | 1.39 | 4.72 | 1.35 |
| | | | | SUM: | 7.92 | 7.08 | SUM/(n-2): | 2.25 |
| | | | | b1: | | 1.12 | | |
| | | | | F Statistic: | 3.93 | F (1, 9, .85): | 2.48 | |
| | | | | p-value: | 0.08 | | | |

In Step 8, a dynamic reliability value can be constructed from the proportions in Step 7 and the hazard functions in Step 6 according to Equation (28). A dynamic reliability model visualization can be constructed according to Equation (29).

$$R_d = \sum_1^k P_C R_C, \tag{28}$$

$$R_d(t) = e^{-\left(\frac{t-\gamma_d}{\eta_d}\right)^{\beta_d}}, \gamma_d = \sum_1^k \gamma_C P_C, \beta_d = \sum_1^k \beta_C P_C, \tag{29}$$

$$\eta_d = \sum_1^k \eta_C P_C$$

Figure 6:
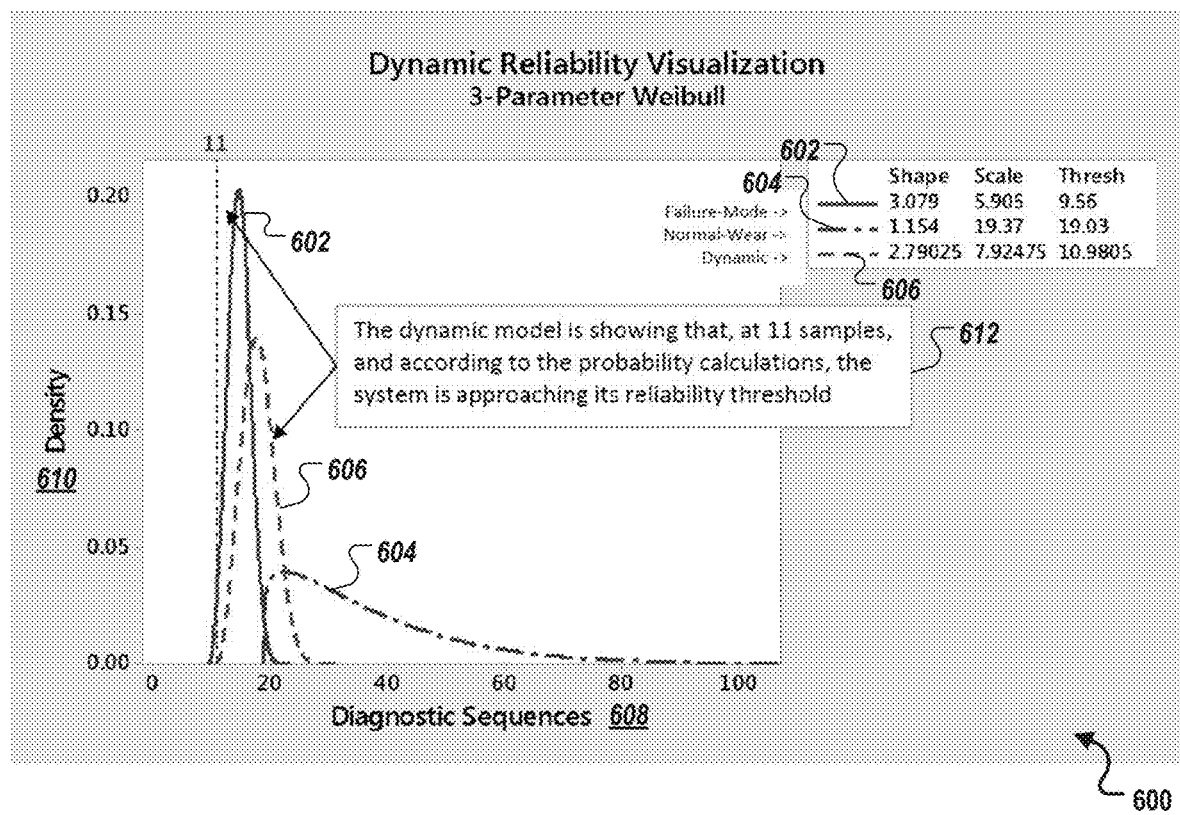
FIG. 6 is a graph showing a plot of the dynamic Reliability model visualization, according to an implementation of the present disclosure.

In an example, according to the results found in Step 7, the dynamic reliability value is given according to Equation (30). The dynamic reliability model is given by Equation (31). A visualization of the dynamic reliability model is shown in FIG. 6. As needed, the Reliability value can be converted to an expected time to failure.

$$R_{dynamic} = .989 \tag{30}$$

$$R_{dynamicvis} = e^{-\frac{t-10.98^{2.79}}{7.93}} \tag{31}$$

FIG. 6 is a graph 600 showing a plot of the dynamic Reliability model visualization, according to an implementation of the present disclosure. The graph 600 includes a failure mode plot 602, a normal wear plot 604, and a dynamic plot 606. The plots 602-606 are plotted relative to an X-axis of diagnostic sequences 608 and a Y-axis of density 610. A conclusion 612 indicates that, according to the probability calculations, the dynamic model shows that the system is approaching its reliability threshold at eleven samples 614.

Figure 7:
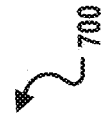
FIG. 7 is a chart showing examples of normalized Eigenvectors that are output by the Kernel Principal Component Analysis (KPCA), according to an implementation of the present disclosure.

FIG. 7 is a chart showing examples of normalized Eigenvectors 700 that are output by the KPCA, according to an implementation of the present disclosure. The normalized Eigenvectors 700 are organized according to the highest degree of correlation following the non-linear transformation. A unique set of Eigenvectors can be produced for each actuator being tested. A desired result of the normalized Eigenvectors 700 is that common principal components will emerge across a range of actuators that are tested by test case group, as shown by underlined examples. The principal components can be used as WPHM covariates to estimate WPHM parameters.

Figure 8:
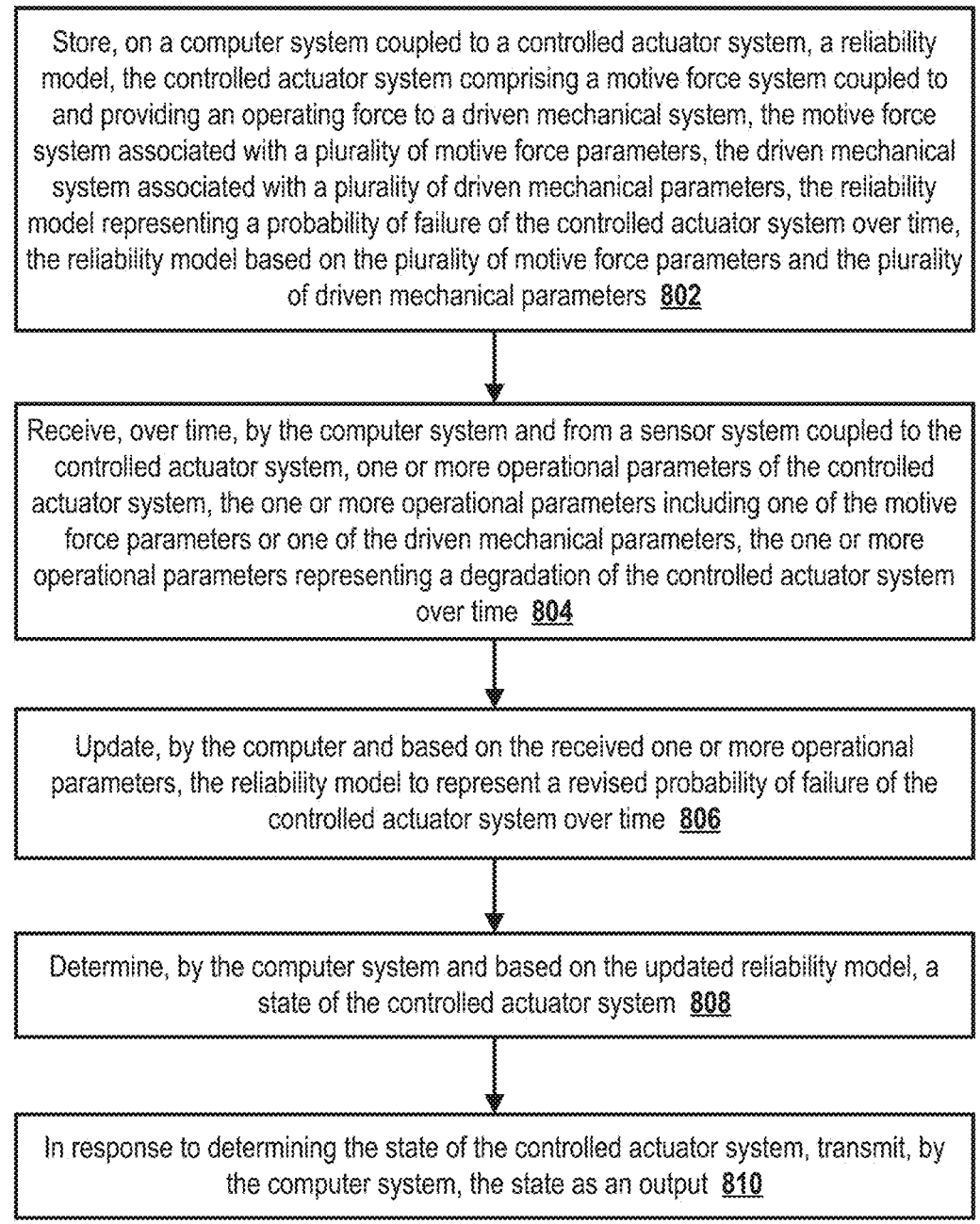
FIG. 8 is a flowchart illustrating an example of a computer-implemented method for determining the state of a controlled actuator system, according to an implementation of the present disclosure.

FIG. 8 is a flowchart illustrating an example of a computer-implemented method 800 for determining the state of a controlled actuator system, according to an implementation of the present disclosure. For clarity of presentation, the description that follows generally describes method 800 in the context of the other figures in this description. For example, steps of method 800 can be carried out by components of the system 100. However, it will be understood that method 800 can be performed, for example, by any system, environment, software, and hardware, or a combination of systems, environments, software, and hardware, as appropriate. In some implementations, various steps of method 800 can be run in parallel, in combination, in loops, or in any order. Models of the components can be represented by Equations 1-23.

At 802, a reliability model is stored on a computer system coupled to a controlled actuator system. The controlled actuator system includes a motive force system coupled to and providing an operating force to a driven mechanical system. The motive force system is associated with multiple motive force parameters. The driven mechanical system is associated with multiple driven mechanical parameters. The reliability model represents a probability of failure of the controlled actuator system over time (for each of multiple operational modes). Each reliability model's hazard rate regression model can be based on the multiple motive force parameters and one or more of the multiple driven mechanical parameters, the set of test definitions and analysis by which the plurality of driven and motive force parameters are acquired, and a plurality of statistical models that use the plurality of driven and motive force parameters to determine the probability of a system existing in an operational mode. As an example, the system 100 can store a reliability model that applies to the system 100, the components 102-110 of the system 100, and components that are listed in Table 1. A set of operational mode definitions can also be stored in addition to storing the reliability model for each operational mode.

In some implementations, the motive force system can be a 3-phase, multi-pole brushless direct current (BLDC) electric motor. The multiple motive force parameters can include, for example, a magnet torque constant, a rotor inertia, unbalanced rotation terms, a set of winding resistances, a set of winding inductances, a set of motor bearing and windage viscous friction parameters, and a set of motor bearing static or dynamic Coulomb friction parameters.

In some implementations, the driven mechanical system can be a rotary or linear actuator directly connected to the BLDC electric motor. For example, the driven mechanical parameters can include an actuator inertia, an actuator bearing viscous friction, a bearing dynamic Coulomb friction, and spring constant, and a valve load. For example, parameters that apply to components of the system 100 are listed above. In some implementations, the driven mechanical system can be a rotary or linear actuator connected to source of motive force by one or more of a direct connection, a geared connection, or a screw-drive conversion.

In some implementations, method 800 can further include storing, on the computer system, the operational modes of the controlled actuator system, actuation sequences, data manipulations, and monitoring parameters calculations associated with the operational mode, a reliability model associated with the operational mode, a regression model associated with the operational mode, a WPHM model associated with the operational mode, a probability model associated with the operational mode, measurement values for the monitoring parameters, a dynamic reliability model reported value, and a dynamic reliability model visualization. For example, the system 100 can store operational mode-specific information that is used as inputs to the Equations 1-23 and information that results from performing steps that are used by the system 100 to arrive at the dynamic reliability value 112.

At 804, one or more operational parameters of the controlled actuator system are received over time. The one or more operational parameters can be received by the computer system from a sensor system coupled to the controlled actuator system. The one or more operational parameters can include one of the motive force parameters or one of the driven mechanical parameters. The one or more operational parameters can represent a degradation of the controlled actuator system over time (for example, when operating a controlled diagnostic sequence). The one or more operational parameters can be received during an operation of the controlled actuator system or can be received when the controlled actuator system is off-line. For example, parameters that are used by components of the system 100 can be received over time and used with respect to calculations performed in the Equations 1-23.

In some implementations, the reliability model can be a first reliability model, and method 800 can further include storing, on the computer system, multiple reliability models including the first reliability model. Each reliability model can be associated with a respective category of operation of the controlled actuator system. The one or more operational parameters of the controlled actuator system can vary based on the category. The hazard rate regression models can vary based on the category, and the statistical models that represent the probability of existing in the respective category can vary based on the category. Each reliability model can represent a respective probability of failure of the controlled actuator system over time when operated based on the one or more operational parameters associated with the respective category. As an example, multiple reliability models can be used, including for various components of the driven mechanical system 102 and the motive force system 104.

In some implementations, the respective category of operation can include at least one of the following. A normal operation is an operation in which the controlled actuator system is operated under a normal operational parameter range for each motive force parameter and each driven mechanical parameter. An accelerated wear operation is an operation in which the controlled actuator system is operated in a condition in which at least one motive force parameter or at least one driven mechanical parameter is operated outside a respective normal operational parameter range. An operation using non-conforming components is an operation in which a component of either the motive force system or the driven mechanical system operates outside the normal operational parameter range for the component. A failure operation is an operation resulting from a failure inducing change to the normal operational parameter of a motive force parameter or a driven mechanical parameter. For example, as described above with reference to Step 1, models that are built for each of the driven system and the source of the motive force can be used to build a coupled model. The source of the motive force can be provided, for example, by a 3-phase, multi-pole BLDC motor that drives a rotary valve that is directly connected to the motor.

At 806, the reliability model is updated according to the hazard rate regression mode to represent a revised probability of failure of the controlled actuator system over time and the statistical model to represent a revised probability of existing in an operational mode. The update is made by the computer and based on the received one or more operational parameters. For example, the computer system 110 can update the reliability model to represent a revised probability of failure over time based on the received one or more operational parameters.

In some implementations, method 800 can further include identifying the respective category from the one or more operational parameters received from the sensor system (for example, using the statistical models that represent the probability of existing in the respective category) and updating a reliability model associated with the identified respective category. For example, as described with reference to Step 2, categories of operation can be identified that would likely appear as independent reliability models with corresponding failure-modes.

At 808, a state of the controlled actuator system is determined by the computer system based on the updated reliability model. For example, the computer system 110 can determine a state that indicates that the controlled actuator system is approaching failure.

At 810, in response to determining the state of the controlled actuator system, the state is transmitted as an output by the computer system. For example, the computer system 110 can transmit a signal indicating that the controlled actuator system is approaching failure. The signal can be transmitted, for example, to a component of the controlled actuator system that indicates that a speed or other setting is to be reduced in order to reduce the probability of failure or to prevent the failure from occurring. In another example, the signal can cause the presentation of a message that is read by a user indicating that the failure is imminent.

In some implementations, in addition to method 800, an additional method can exist for identifying parameters and determining models. The method can be implemented by components of the system 100, for example, The method can include: identifying a plurality of driven mechanical parameters associated with a driven mechanical system; identifying a plurality of motive force parameters associated with a motive force system coupled to and driven by the driven mechanical system; identifying, for each driven mechanical parameter and each motive force parameter, a respective value; determining a plurality of diagnostic sequence test and analysis definitions necessary to arrive at a respective value for the driven and motive force parameters; determining a plurality of regression models relating the driven mechanical parameters and motive force parameters to remaining life; determining an operational mode representing an operation of the driven mechanical system driven by the motive force system based on each respective value identified for each driven mechanical parameter and each motive force parameter; determining a plurality of statistical models representing the probability of existing in an identified operational mode; determining a plurality of reliability models representing the probability of failure of the controlled actuator system; measuring one or more operational parameters during an off-line operation of the motive force system to drive the driven mechanical system, where the one or more operational parameters represent degradation of the controlled actuator system; updating the statistical model representing the probability of existing in an identified operational mode used the measured parameters; updating the reliability model's regression model using the measured parameters; and identifying a set of metrics that describe the degradation of the motive force system driven by the driven mechanical system over time using a statistical method and the one or more operational parameters measured during the off-line operation. In some implementations, updating the expected behavior can include developing a dynamic reliability model representing an updated expected behavior based on the set of probabilities from the statistical models for each operational mode and the set of updated reliability models for each operational mode.

Figure 9:
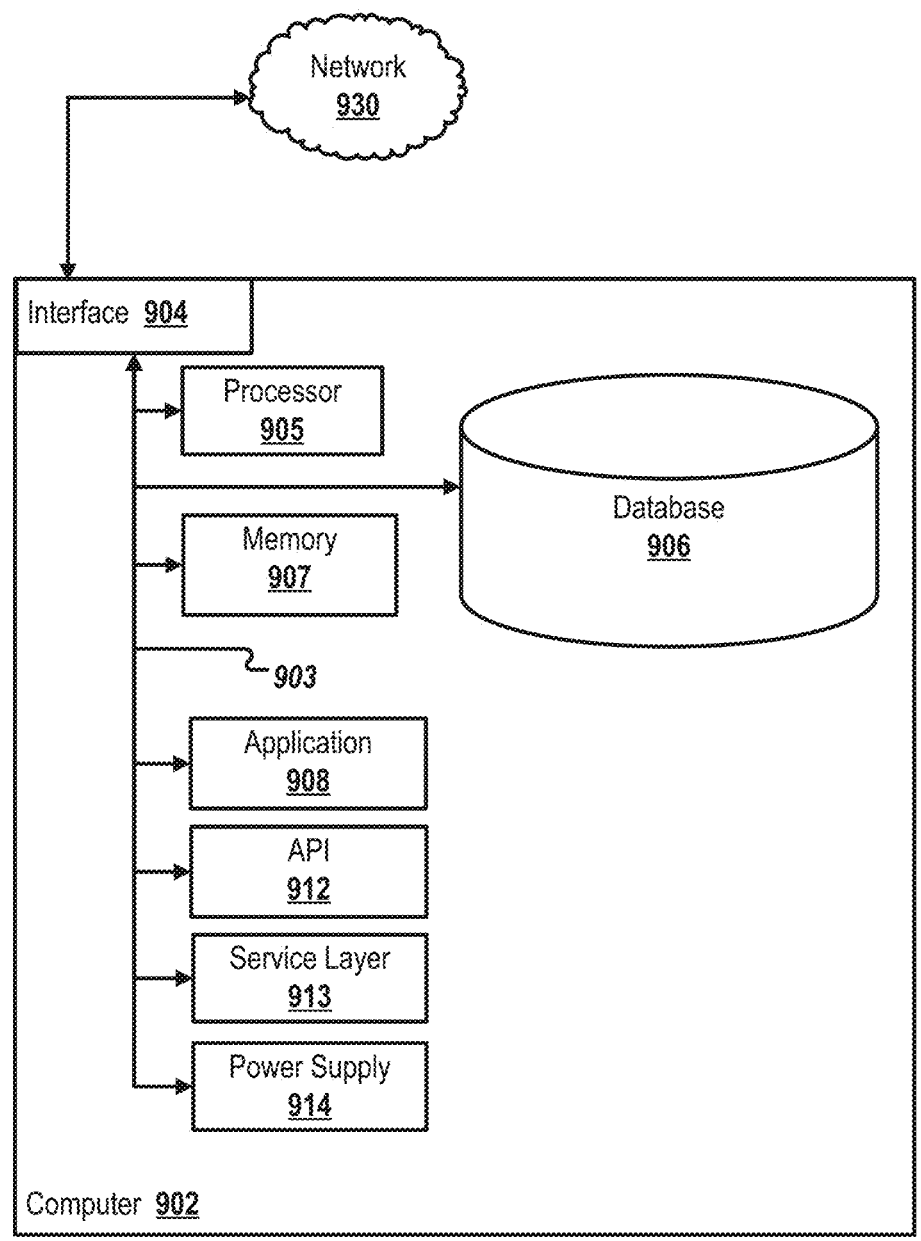
FIG. 9 is a block diagram illustrating an example of a computer-implemented system used to provide computational functionalities associated with described algorithms, methods, functions, processes, flows, and procedures, according to an implementation of the present disclosure.

FIG. 9 is a block diagram illustrating an example of a computer-implemented system 900 used to provide computational functionalities associated with described algorithms, methods, functions, processes, flows, and procedures, according to an implementation of the present disclosure. In the illustrated implementation, system 900 includes a computer 902 and a network 930.

The illustrated computer 902 is intended to encompass any computing device such as a server, desktop computer, laptop/notebook computer, wireless data port, smart phone, personal data assistant (PDA), tablet computer, one or more processors within these devices, another computing device, or a combination of computing devices, including physical or virtual instances of the computing device, or a combination of physical or virtual instances of the computing device. Additionally, the computer 902 can include an input device, such as a keypad, keyboard, touch screen, another input device, or a combination of input devices that can accept user information, and an output device that conveys information associated with the operation of the computer 902, including digital data, visual, audio, another type of information, or a combination of types of information, on a graphical-type user interface (UI) (or GUI) or other UI. For example, in some implementations, data presented in a GUI or other GUIs (whether illustrated or not) can be interactive in nature and be configured to permit user actions to be performed (such as, triggering messages or requests for data to change, modify, or enhance the illustrated data or to perform actions based on the illustrated data).

The computer 902 can serve in a role in a distributed computing system as a client, network component, a server, a database or another persistency, another role, or a combination of roles for performing the subject matter described in the present disclosure. The illustrated computer 902 is communicably coupled with a network 930. In some implementations, one or more components of the computer 902 can be configured to operate within an environment, including cloud-computing-based, local, global, another environment, or a combination of environments.

At a high level, the computer 902 is an electronic computing device operable to receive, transmit, process, store, or manage data and information associated with the described subject matter. According to some implementations, the computer 902 can also include or be communicably coupled with a server, including an application server, e-mail server, web server, caching server, streaming data server, another server, or a combination of servers.

The computer 902 can receive requests over network 930 (for example, from a client software application executing on another computer 902) and respond to the received requests by processing the received requests using a software application or a combination of software applications. In addition, requests can also be sent to the computer 902 from internal users (for example, from a command console or by another internal access method), external or third-parties, or other entities, individuals, systems, or computers. System models, reliability models, hazard models, and any other models can be updated remotely as more data is collected from the field.

Each of the components of the computer 902 can communicate using a system bus 903. In some implementations, any or all of the components of the computer 902, including hardware, software, or a combination of hardware and software, can interface over the system bus 903 using an application programming interface (API) 912, a service layer 913, or a combination of the API 912 and service layer 913. The API 912 can include specifications for routines, data structures, and object classes. The API 912 can be either computer-language independent or dependent and refer to a complete interface, a single function, or even a set of APIs. The service layer 913 provides software services to the computer 902 or other components (whether illustrated or not) that are communicably coupled to the computer 902. The functionality of the computer 902 can be accessible for all service consumers using this service layer. Software services, such as those provided by the service layer 913, provide reusable, defined functionalities through a defined interface. For example, the interface can be software written in JAVA, C++, another computing language, or a combination of computing languages providing data in extensible markup language (XML) format, another format, or a combination of formats. While illustrated as an integrated component of the computer 902, alternative implementations can illustrate the API 912 or the service layer 913 as stand-alone components in relation to other components of the computer 902 or other components (whether illustrated or not) that are communicably coupled to the computer 902. Moreover, any or all parts of the API 912 or the service layer 913 can be implemented as a child or a sub-module of another software module, enterprise application, or hardware module without departing from the scope of the present disclosure.

The computer 902 includes an interface 904. Although illustrated as a single interface 904 in FIG. 9, two or more interfaces 904 can be used according to particular needs, desires, or particular implementations of the computer 902. The interface 904 is used by the computer 902 for communicating with another computing system (whether illustrated or not) that is communicatively linked to the network 930 in a distributed environment. Generally, the interface 904 is operable to communicate with the network 930 and includes logic encoded in software, hardware, or a combination of software and hardware. More specifically, the interface 904 can include software supporting one or more communication protocols associated with communications such that the network 930 or interface's hardware is operable to communicate physical signals within and outside of the illustrated computer 902.

The computer 902 includes a processor 905. Although illustrated as a single processor 905 in FIG. 9, two or more processors can be used according to particular needs, desires, or particular implementations of the computer 902. Generally, the processor 905 executes instructions and manipulates data to perform the operations of the computer 902 and any algorithms, methods, functions, processes, flows, and procedures as described in the present disclosure.

The computer 902 also includes a database 906 that can hold data for the computer 902, another component communicatively linked to the network 930 (whether illustrated or not), or a combination of the computer 902 and another component. For example, database 906 can be an in-memory, conventional, or another type of database storing data consistent with the present disclosure. In some implementations, database 906 can be a combination of two or more different database types (for example, a hybrid in-memory and conventional database) according to particular needs, desires, or particular implementations of the computer 902 and the described functionality. Although illustrated as a single database 906 in FIG. 9, two or more databases of similar or differing types can be used according to particular needs, desires, or particular implementations of the computer 902 and the described functionality. While database 906 is illustrated as an integral component of the computer 902, in alternative implementations, database 906 can be external to the computer 902.

The computer 902 also includes a memory 907 that can hold data for the computer 902, another component or components communicatively linked to the network 930 (whether illustrated or not), or a combination of the computer 902 and another component. Memory 907 can store any data consistent with the present disclosure. In some implementations, memory 907 can be a combination of two or more different types of memory (for example, a combination of semiconductor and magnetic storage) according to particular needs, desires, or particular implementations of the computer 902 and the described functionality. Although illustrated as a single memory 907 in FIG. 9, two or more memories 907 or similar or differing types can be used according to particular needs, desires, or particular implementations of the computer 902 and the described functionality. While memory 907 is illustrated as an integral component of the computer 902, in alternative implementations, memory 907 can be external to the computer 902.

The application 908 is an algorithmic software engine providing functionality according to particular needs, desires, or particular implementations of the computer 902, particularly with respect to functionality described in the present disclosure. For example, application 908 can serve as one or more components, modules, or applications. Further, although illustrated as a single application 908, the application 908 can be implemented as multiple applications 908 on the computer 902. In addition, although illustrated as integral to the computer 902, in alternative implementations, the application 908 can be external to the computer 902.

The computer 902 can also include a power supply 914. The power supply 914 can include a rechargeable or non-rechargeable battery that can be configured to be either user- or non-user-replaceable. In some implementations, the power supply 914 can include power-conversion or management circuits (including recharging, standby, or another power management functionality). In some implementations, the power-supply 914 can include a power plug to allow the computer 902 to be plugged into a wall socket or another power source to, for example, power the computer 902 or recharge a rechargeable battery.

There can be any number of computers 902 associated with, or external to, a computer system containing computer 902, each computer 902 communicating over network 930. Further, the term "client," "user," or other appropriate terminology can be used interchangeably, as appropriate, without departing from the scope of the present disclosure. Moreover, the present disclosure contemplates that many users can use one computer 902, or that one user can use multiple computers 902.

In some implementations, another innovative aspect of the subject matter described in this specification can be embodied in methods that include the actions of storing, on a computer system coupled to a controlled actuator system, a reliability model, the controlled actuator system comprising a motive force system coupled to and providing an operating force to a driven mechanical system, the motive force system associated with a plurality of motive force parameters, the driven mechanical system associated with a plurality of driven mechanical parameters, the reliability model representing a probability of failure of the controlled actuator system over time, the reliability model based on the plurality of motive force parameters and the plurality of driven mechanical parameters; receiving, over time, by the computer system and from a sensor system coupled to the controlled actuator system, one or more operational parameters of the controlled actuator system, the one or more operational parameters including one of the motive force parameters or one of the driven mechanical parameters, the one or more operational parameters representing a degradation of the controlled actuator system over time; updating, by the computer and based on the received one or more operational parameters, the reliability model to represent a revised probability of failure of the controlled actuator system over time; determining, by the computer system and based on the updated reliability model, a state of the controlled actuator system; and in response to determining the state of the controlled actuator system, transmitting, by the computer system, the state as an output.

Other embodiments of this aspect include corresponding systems, apparatus, and computer programs, configured to perform the actions of the methods, encoded on computer storage devices.

These and other embodiments can each optionally include one or more of the following features. The state of the controlled actuator system can be approaching failure, and transmitting the state of the controlled actuator system can include transmitting a signal indicating that the controlled actuator system is approaching failure. The method can further include storing, on the computer system, on operational modes of the controlled actuator system, monitoring parameters associated with the reliability model, a regression model associated with the reliability model, monitoring tests associated with the reliability model, a probability model, a dynamic reliability model reported value and a dynamic reliability model visualization. The reliability model can be a first reliability model, and the method can further include storing, on the computer system, a plurality of reliability models including the first reliability model, where each reliability model can be associated with a respective category of operation of the controlled actuator system, where the one or more operational parameters of the controlled actuator system can vary based on the category, and where each reliability model can represent a respective probability of failure of the controlled actuator system over time when operated based on the one or more operational parameters associated with the respective category. The respective category of operation can include at least one of: normal operation in which the controlled actuator system is operated under a normal operational parameter range for each motive force parameter and each driven mechanical parameter, accelerated wear operation in which the controlled actuator system is operated in a condition in which at least one motive force parameter or at least one driven mechanical parameter is operated outside a respective normal operational parameter range, operation using non-conforming components in which a component of either the motive force system or the driven mechanical system operates outside the normal operational parameter range for the component, or failure operation resulting from a failure inducing change to the normal operational parameter of a motive force parameter or a driven mechanical parameter. The method can further include identifying the respective category from the one or more operational parameters received from the sensor system and updating a reliability model associated with the identified respective category. The one or more operational parameters are received during an operation of the controlled actuator system. The one or more operational parameters can be received when the controlled actuator system is off-line. The motive force system can include a 3-phase, multi-pole brushless direct current (BLDC) electric motor. The plurality of motive force parameters can include a magnet torque constant, a rotor inertia, a winding resistance, a winding inductance, a motor bearing and windage viscous friction and a motor bearing dynamic Coulomb friction. The driven mechanical system can include a rotary or linear actuator directly connected to the BLDC electric motor. The driven mechanical parameters can include an actuator inertia, an actuator bearing viscous friction, a bearing dynamic Coulomb friction, and a valve load.

In conclusion, the techniques described in the present disclosure can provide the following. First, structured engineering analysis and a detailed physical model can be used to identify modes of operation, potential tests to run, and corresponding factors to monitor that should correlate with reliability. Second, reliability testing can be performed and statistical methods (such as KPCA) can be used to identify factors that do correlate with reliability for each unit and to identify the set of factors that are common across operational modes. Third, the reliability model for each operational mode can be identified using standard methods. Identify a regression model for each operational mode based on the common factors. A corresponding dynamic hazard function can be developed using a method such as WPHM. Fourth, statistical tests can be developed, such as F-tests to determine the probability that a given operational mode is active. Fifth, the techniques can be used on a new unit is in operation to collect data for all factors and all operational modes. With each new data point, statistical tests can be performed and dynamic hazard functions can be calculated. The resulting information that is obtained can be combined into a dynamic reliability model.

In some implementations, transmitting the state of the controlled actuator system can be provided in forms that are useful to a customer in making decisions, including repair or replacement of equipment. For example, the state of the controlled actuator system can be provided in terms of one or more of a projected failure date/time, a percent life remaining, or a health-check number. The information can be provided with other data, including historical replacement/repair statistics and industry averages for the same or similar equipment.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method comprising:
    storing, on a computer system coupled to a controlled actuator system at a site, a set of operational mode definitions, a reliability model per operational mode, the controlled actuator system comprising a motive force system at the site coupled to and providing an operating force to a motor-driven mechanical system at the site, the motive force system associated with a plurality of motive force parameters, the motor-driven mechanical system associated with a plurality of motor-driven mechanical parameters, a reliability model representing a probability of failure of the controlled actuator system over time for each operational mode, each reliability model including a hazard rate regression model based on one or more of the plurality of motive force parameters and one or more of the plurality of motor-driven mechanical parameters, a set of test definitions and analysis by which the plurality of motor-driven and motive force parameters are acquired, and a plurality of statistical models that use the plurality of motor-driven and motive force parameters to determine the probability of a system existing in an operational mode, wherein the reliability model is executed by an Internet of Things (IoT) reliability prediction system controller and includes relationships between expected energy consumption rates of a motor for each operational mode of the motor and an expected time-to-failure of the motor;

receiving, over time, by the computer system and from a sensor system at the site coupled to the controlled actuator system, one or more operational parameters of the controlled actuator system, the one or more operational parameters including one of the motive force parameters or one of the motor-driven mechanical parameters, the one or more operational parameters representing a degradation of the controlled actuator system over time;

updating, by the computer system and based on the received one or more operational parameters, the reliability model according to the hazard rate regression model to represent a revised probability of failure of the controlled actuator system over time and the statistical model to represent a revised probability of existing in an operational mode;

determining, by the computer system and based on the updated reliability model and an energy consumption rate of the motor at the operational mode, that the controlled actuator system is approaching failure;

in response, transmitting, by the computer system, a signal indicating that the controlled actuator system is approaching failure;

providing, by the computer system through the cloud to an original equipment manufacturer (OEM), feedback associated with equipment used in the controlled actuator system, wherein the feedback includes at least the energy consumption rate of the motor at the operational mode;

receiving, by the computer system through the cloud from the OEM, information identifying replacement builds by the OEM to occur before actual failure of the controlled actuator system, wherein the replacement builds identify new equipment from the OEM to be delivered to the site;

commanding, by the computer system in response to determining that the controlled actuator system is approaching failure, a change in operation of one or more actuators of the controlled actuator system based on receipt of the signal indicating that the controlled actuator system is approaching failure; and receiving, after receiving the information identifying the replacement builds, the new equipment at the site.

2. The method of claim 1, wherein the reliability model is a first reliability model, wherein the method further comprises storing, on the computer system, a plurality of reliability models including the first reliability model, wherein each reliability model is associated with a respective category of operation of the controlled actuator system, wherein the one or more operational parameters of the controlled actuator system vary based on the category, the hazard rate regression models vary based on the category, and the statistical models that represent the probability of existing in the respective category vary based on the category, wherein each reliability model represents a respective probability of failure of the controlled actuator system over time when operated based on the one or more operational parameters associated with the respective category.

3. The method of claim 2, wherein the respective category of operation comprises at least one of:

normal operation in which the controlled actuator system is operated under a normal operational parameter range for each motive force parameter and each motor-driven mechanical parameter, accelerated wear operation in which the controlled actuator system is operated in a condition in which at least one motive force parameter or at least one motor-driven mechanical parameter is operated outside a respective normal operational parameter range, operation using non-conforming components in which a component of either the motive force system or the motor-driven mechanical system operates outside the normal operational parameter range for the component, or failure operation resulting from a failure inducing change to the normal operational parameter of a motive force parameter or a motor-driven mechanical parameter.

4. The method of claim 2, further comprising:

identifying the respective category from the one or more operational parameters received from the sensor system using the statistical models that represent the probability of existing in the respective category; and updating a reliability model associated with the identified respective category.

5. The method of claim 1, wherein the one or more operational parameters are received during an operation of the controlled actuator system.

6. The method of claim 1, wherein the one or more operational parameters are received when the controlled actuator system is off-line and operating a controlled diagnostic sequence.

7. The method of claim 1, wherein the motive force system comprises an electric motor motive force or a hydraulic actuator motive force.

8. The method of claim 7, wherein the plurality of motive force parameters includes a magnet torque constant, a rotor inertia, unbalanced rotation terms, a set of winding resistances, a set of winding inductances, a set of motor bearing and windage viscous friction, and a set of motor bearing static or dynamic Coulomb friction.

9. The method of claim 7, wherein the motor-driven mechanical system comprises a rotary or linear actuator connected to source of motive force by one or more of a plurality of: a direct connection, a geared connection, or a screw-drive conversion.

10. The method of claim 9, wherein the motor-driven mechanical parameters comprise an actuator inertia and mass, a set of spring constants, a gear meshing constant, frequency, and phase, a set of screw-drive efficiencies, backlash and dead-band terms, unbalanced rotation terms, non-aligned linear motion terms, a set of actuator bearing viscous frictions, a set of bearing and shaft on seal dynamic or static Coulomb frictions, and a valve load.

11. The method of claim 1, wherein commanding the change in operation of the one or more actuators is further in response to providing the feedback to the OEM and receiving the information identifying the replacement builds by the OEM.

12. A system comprising:
a motor-driven mechanical system at a site, the motor-driven mechanical system associated with a plurality of motor-driven mechanical parameters;
a motive force system at the site coupled to and driven by the motor-driven mechanical system, the motive force system associated with a plurality of motive force parameters;
a sensor system at the site comprising a plurality of sensors, the sensor system coupled to the motor-driven mechanical system or the motive force system, the plurality of sensors configured to sense one or more operational parameters of a controlled actuator system, the one or more operational parameters including one of the motive force parameters or one of the motor-driven mechanical parameters, the one or more operational parameters representing a degradation of the controlled actuator system over time; and
a computer system at the site coupled to the motor-driven mechanical system, the motive force system, and the sensor system, the computer system comprising:
one or more processors; and
a non-transitory computer-readable medium storing instructions executable by the one or more processors to perform operations comprising:
storing a reliability model representing a probability of failure of the controlled actuator system over time for each operational mode, each reliability model's hazard rate regression model based on one or more of the plurality of motive force parameters and one or more of the plurality of motor-driven mechanical parameters, a set of test definitions and analysis by which the plurality of driven and motive force parameters are acquired, and a plurality of statistical models that use the plurality of driven and motive force parameters to determine the probability of a system existing in an operational mode, wherein the reliability model is executed by an Internet of Things (IoT) reliability prediction system controller and includes relationships between expected energy consumption rates of a motor for each operational mode of the motor and an expected time-to-failure of the motor;
updating the reliability model to represent a revised probability of failure over time based on the received one or more operational parameters and updating the statistical model to represent the probability of existing in an operational mode;
determining, by the computer system and based on the updated reliability model and an energy consumption rate of the motor at the operational mode, that either the motor-driven mechanical system or the motive force system is approaching failure;
in response, transmitting, by the computer system, a signal indicating that either the motor-driven mechanical system or the motive force system is approaching failure;
providing, by the computer system through the cloud to an original equipment manufacturer (OEM), feedback associated with equipment used in the controlled actuator system, wherein the feedback includes at least the energy consumption rate of the motor at the operational mode;
receiving, by the computer system through the cloud from the OEM, information identifying replacement builds by the OEM to occur before actual failure of the controlled actuator system, wherein the replacement builds identify new equipment from the OEM to be delivered to the site;
commanding, by the computer system in response to determining that the controlled actuator system is approaching failure, a change in operation of one or more actuators of the controlled actuator system based on receipt of the signal indicating that the controlled actuator system is approaching failure; and
receiving, after receiving the information identifying the replacement builds, the new equipment at the site.

13. The system of claim 12, wherein the one or more operational parameters are received during an operation of the controlled actuator system.

14. The system of claim 12, wherein the one or more operational parameters are received when the controlled actuator system is off-line and operating a controlled diagnostic sequence.

15. The system of claim 12, wherein the motive force system comprises an electric motor motive force or a hydraulic actuator motive force.

16. The system of claim 15, wherein the plurality of motive force parameters includes a magnet torque constant, a rotor inertia, unbalanced rotation terms, a set of winding resistances, a set of winding inductances, a set of motor bearing and windage viscous friction, and a set of motor bearing static or dynamic Coulomb friction.

17. The system of claim 15, wherein the motor-driven mechanical system comprises a rotary or linear actuator connected to source of motive force by one or more of a plurality of: a direct connection, a geared connection, or a screw-drive conversion.

18. The system of claim 17, wherein the motor-driven mechanical parameters comprise an actuator inertia and mass, a set of spring constants, a gear meshing constant, frequency, and phase, a set of screw-drive efficiencies, backlash and dead-band terms, unbalanced rotation terms, non-aligned linear motion terms, a set of actuator bearing viscous frictions, a set of bearing and shaft on seal dynamic or static Coulomb frictions, and a valve load.

19. A method comprising:
identifying a plurality of motor-driven mechanical parameters associated with a motor-driven mechanical system at a site;
identifying a plurality of motive force parameters associated with a motive force system at the site coupled to and driven by the motor-driven mechanical system;
identifying, for each motor-driven mechanical parameter and each motive force parameter, a respective value;
determining a plurality of diagnostic sequence test and analysis definitions necessary to arrive at a respective value for the motor-driven mechanical and motive force parameters;
determining a plurality of regression models relating the motor-driven mechanical parameters and motive force parameters to remaining life;

determining an operational mode representing an operation of the motor-driven mechanical system driven by the motive force system based on each respective value identified for each motor-driven mechanical parameter and each motive force parameter;

determining a plurality of statistical models representing a probability of existing in an identified operational mode;

determining a plurality of reliability models representing a probability of failure of a controlled actuator system at the site, wherein each reliability model is executed by an Internet of Things (IoT) reliability prediction system controller and includes relationships between expected energy consumption rates of a motor for each operational mode of the motor and an expected time-to-failure of the motor;

measuring one or more operational parameters during an off-line operation of the motive force system to drive the motor-driven mechanical system, wherein the one or more operational parameters represent degradation of the controlled actuator system; updating the statistical model representing the probability of existing in an identified operational mode used the measured parameters;

updating the reliability model's regression model using the measured parameters;

identifying a set of metrics that describe the degradation of the motive force system driven by the motor-driven mechanical system over time using a statistical method and the one or more operational parameters measured during the off-line operation; and determining, based on the updated reliability model and an energy consumption rate of the motor at the operational mode, that either the motor-driven mechanical system or the motive force system is approaching failure;

in response, transmitting a signal indicating that either the motor-driven mechanical system or the motive force system is approaching failure;

providing, by a computer system through the cloud to an original equipment manufacturer (OEM), feedback associated with equipment used in the controlled actuator system, wherein the feedback includes at least the energy consumption rate of the motor at the operational mode;

receiving, by a computer system through the cloud from the OEM, information identifying replacement builds by the OEM to occur before actual failure of the controlled actuator system, wherein the replacement builds identify new equipment from the OEM to be delivered to the site;

commanding, by the computer system in response to determining that the controlled actuator system is approaching failure, a change in operation of one or more actuators of the controlled actuator system based on receipt of the signal indicating that the controlled actuator system is approaching failure; and receiving, after receiving the information identifying the replacement builds, the new equipment at the site.

20. The method of claim 19, further comprising:

developing a dynamic reliability model representing an updated expected behavior based on a set of probabilities, alpha errors and beta errors from the statistical models for each operational mode and a set of updated regression models for each operational mode.

* * * * *